(12) United States Patent
Hamilton et al.

(10) Patent No.: US 9,584,191 B2
(45) Date of Patent: Feb. 28, 2017

(54) ANTENNA TUNING UNIT

(71) Applicant: Southern Avionics Co., Beaumont, TX (US)

(72) Inventors: George Timothy Hamilton, Orange, TX (US); Donald James Sands, Rosenberg, TX (US); Russell Wayne Cowles, Lumberton, TX (US)

(73) Assignee: Southern Avionics Co., Beaumont, TX (US)

( * ) Notice: Subject to any disclaimer, the term of this patent is extended or adjusted under 35 U.S.C. 154(b) by 0 days.

(21) Appl. No.: 14/135,919

(22) Filed: Dec. 20, 2013

(65) Prior Publication Data

US 2015/0180593 A1     Jun. 25, 2015

(51) Int. Cl.
*H04B 5/00*     (2006.01)
*H01Q 1/50*     (2006.01)
(Continued)

(52) U.S. Cl.
CPC ............ *H04B 5/0043* (2013.01); *H01Q 1/50* (2013.01); *H03F 1/565* (2013.01); *H03H 7/40* (2013.01);
(Continued)

(58) Field of Classification Search
CPC combination set(s) only.
See application file for complete search history.

(56) References Cited

U.S. PATENT DOCUMENTS 2,884,632 A * 4/1959 De Witz ................. H01F 21/08
                                                    333/17.1
3,794,941 A   2/1974 Templin
(Continued)

FOREIGN PATENT DOCUMENTS

CA      2206379         12/1997
CA      2558294 A1      8/2005
(Continued)

OTHER PUBLICATIONS

Randy Rhea, High Frequency Electronics Mar. 2006, p. 16-25.*
(Continued)

*Primary Examiner* — Ankur Jain
*Assistant Examiner* — Zhitong Chen

(57) ABSTRACT

A system, apparatus, and method directed to impedance matching an antenna with a transmitter for non-directional radio beacons. The apparatus includes an L-type impedance network comprising non-capacitive elements and at least one variable inductor on each branch of the impedance network. Also, system, apparatus, and method directed to providing a low power signal for tuning the antenna. The apparatus includes an impedance matching network and a signal generator. Also, a system, apparatus, and method directed to providing an estimate of near-field strength of a signal from an antenna. The apparatus includes an impedance matching network, a near-field signal strength detector, and microcontroller configured to estimate the near-field signal strength. Corresponding systems includes using the respective apparatuses between an antenna and a transmitter. Corresponding methods are directed to the use of the apparatuses and systems.

52 Claims, 12 Drawing Sheets

(51) Int. Cl.
  *H03H 7/38* (2006.01)
  *H03F 1/56* (2006.01)
  *H04B 1/04* (2006.01)
  *H03H 7/40* (2006.01)
  H04B 17/11 (2015.01)
  H04B 17/21 (2015.01)
  H04B 17/318 (2015.01)

(52) U.S. Cl.
  CPC .......... *H04B 1/0458* (2013.01); *H03H 7/38* (2013.01); *H04B 17/11* (2015.01); *H04B 17/21* (2015.01); *H04B 17/318* (2015.01)

(56) References Cited

U.S. PATENT DOCUMENTS

| | | | |
|---|---|---|---|
| 4,234,960 A | 11/1980 | Spilsbury et al. | |
| 4,454,510 A | 6/1984 | Crow | |
| 4,689,803 A | 8/1987 | Johannessen et al. | |
| 4,701,732 A | 10/1987 | Nestlerode | |
| 4,951,009 A | 8/1990 | Collins | |
| 4,965,607 A | 10/1990 | Wilkins et al. | |
| 5,189,978 A | 3/1993 | McAllister | |
| 5,631,611 A | 5/1997 | Luu | |
| 5,859,878 A | 1/1999 | Phillips et al. | |
| 5,867,535 A | 2/1999 | Phillips et al. | |
| 5,960,350 A | 9/1999 | Schorman et al. | |
| 5,970,398 A | 10/1999 | Tuttle | |
| 6,081,700 A * | 6/2000 | Salvi | H04B 1/18 455/193.3 |
| 6,570,462 B2 | 5/2003 | Edmonson et al. | |
| 7,107,026 B2 | 9/2006 | Pinks | |
| 7,161,527 B2 | 1/2007 | Vacanti | |
| 7,180,467 B2 | 2/2007 | Fabrega-Sanchez et al. | |
| 7,565,610 B2 | 7/2009 | Li et al. | |
| 7,672,758 B2 | 3/2010 | Astruc | |
| 7,696,936 B2 | 4/2010 | Hilgers | |
| 7,703,407 B2 | 4/2010 | Dunn | |
| 7,756,632 B2 | 7/2010 | Wise et al. | |
| 7,792,548 B2 | 9/2010 | Rofougaran | |
| 7,865,610 B2 | 1/2011 | Schmid et al. | |
| 7,970,091 B2 | 6/2011 | Walker | |
| 7,996,035 B2 | 8/2011 | Nguyen et al. | |
| 8,068,798 B2 | 11/2011 | Wilcox et al. | |
| 8,089,942 B2 | 1/2012 | Cai et al. | |
| 8,126,407 B2 | 2/2012 | Jongsma et al. | |
| 8,140,035 B2 | 3/2012 | Hardy et al. | |
| 8,208,878 B1 | 6/2012 | Hardy et al. | |
| 8,213,885 B2 | 7/2012 | Walker | |
| 8,340,935 B2 | 12/2012 | Leibfritz et al. | |
| 8,369,431 B2 | 2/2013 | Walker et al. | |
| 8,384,475 B2 | 2/2013 | Gustavsson et al. | |
| 8,424,802 B2 | 4/2013 | Tripier-Larivaud | |
| 8,442,706 B2 | 5/2013 | Doeppner et al. | |
| 8,446,994 B2 | 5/2013 | Rawlins et al. | |
| 8,452,245 B2 | 5/2013 | Walker | |
| 8,472,904 B2 | 6/2013 | White | |
| 8,526,931 B1 | 9/2013 | Fraley | |
| 8,548,488 B2 | 10/2013 | Anderson et al. | |
| 8,918,234 B2 | 12/2014 | Covington et al. | |
| 9,094,057 B2 | 7/2015 | Low et al. | |
| 9,225,060 B2 | 12/2015 | Bair et al. | |
| 2004/0032363 A1* | 2/2004 | Schantz | H04B 5/0075 342/127 |
| 2004/0104785 A1 | 6/2004 | Park et al. | |
| 2005/0151662 A1 | 7/2005 | Kashuba et al. | |
| 2005/0181750 A1* | 8/2005 | Pinks | H04B 1/0458 455/127.1 |
| 2008/0211320 A1 | 9/2008 | Cook et al. | |
| 2009/0143018 A1 | 6/2009 | Anderson et al. | |
| 2009/0231223 A1* | 9/2009 | Laronda | H01Q 7/005 343/748 |
| 2009/0289871 A1* | 11/2009 | Lin et al. | 343/860 |
| 2011/0039504 A1 | 2/2011 | Nguyen et al. | |
| 2011/0248832 A1 | 10/2011 | Waffaoui et al. | |
| 2011/0299438 A1 | 12/2011 | Mikhemar et al. | |
| 2012/0050015 A1* | 3/2012 | Low | G06K 7/10158 340/10.1 |
| 2012/0153739 A1 | 6/2012 | Cooper et al. | |
| 2013/0021220 A1 | 1/2013 | Bair et al. | |
| 2013/0033996 A1 | 2/2013 | Song et al. | |
| 2013/0076987 A1 | 3/2013 | Wilson et al. | |
| 2013/0093447 A1 | 4/2013 | Nickel et al. | |
| 2013/0215946 A1 | 8/2013 | Walker et al. | |
| 2013/0260816 A1 | 10/2013 | Plevridis et al. | |
| 2013/0328734 A1 | 12/2013 | Thind | |
| 2014/0081484 A1 | 3/2014 | Covington et al. | |
| 2014/0168609 A1 | 6/2014 | Bertin | |
| 2014/0244079 A1 | 8/2014 | Iraudo et al. | |
| 2014/0365044 A1 | 12/2014 | Canale et al. | |

FOREIGN PATENT DOCUMENTS

| | | | |
|---|---|---|---|
| CA | 2581408 | A1 | 9/2008 |
| CA | 2686205 | A1 | 7/2009 |
| EP | 2109224 | A2 | 10/2009 |
| EP | 2124346 | A2 | 11/2009 |
| EP | 2148434 | A1 | 1/2010 |
| WO | WO-2005/078922 | A1 | 8/2005 |
| WO | WO-2005/099141 | A2 | 10/2005 |
| WO | WO-2006/134327 | A2 | 12/2006 |
| WO | WO-2009/092150 | A1 | 7/2009 |

OTHER PUBLICATIONS

High Frequency Electronics Mar. 2006, p. 16-25 (Hereinafter Rhea).*

PCT International Search Report for International Application No. PCT/US2014/070001 mailed May 14, 2015 (5 pages).

PCT Written Opinion of the International Searching Authority for International Application No. PCT/US2014/070001 mailed May 14, 2015 (22 pages).

PCT Invitation to Pay Additional Fees and, Where Applicable, Protest Fee, International Application No. PCT/US2014/070001, mailed Feb. 13, 2015 from the PCT International Searching Authority, 2 pages.

Campos, et al, "Robotic Strategies to Assist Pilots in Landing and Takeoff of Helicopters on Ships and Offshore", 2010, 17 pages, Cutting Edge Robotics uploaded from http://cdn.intechopen.com/pdfs-wm/12196.pdf; In particular, Section 1, para. 1-2 and Section 5.1, para. 1-2.

Thales Group, "CVOR 431", 1 page, printed from https://www.thalesgroup.com/en/worldwide/aerospace/cvor-431 on Jan. 13, 2015.

Thales Group, "DME 415/435 RPM", 1 page, printed from https://www.thalesgroup.com/en/worldwide/aerospace/dme-415435-rpm on Jan. 13, 2015.

Selex ES Inc., "VHF Omni—Directional Range", 1 page, Copyright © 2014 Selex ES Inc—A Finmeccanica Company, printed from http://www.us.selex-es.com/capabilities/atm/navigation/vhf-omni-directional-range on Jan. 13, 2015.

Selex ES Inc., "Distance Measuring Equipment", 1 page, Copyright © 2014 Selex ES Inc—A Finmeccanica Company, printed from http://www.us.selex-es.com/capabilities/atm/navigation/distance-measuring-equipment on Jan. 13, 2015.

Moog Inc., "Tactical Air Navigation (TACAN)", 2 pages, Copyright © 2014 Moog Inc., printed from http://www.moog.com/products/navigation-surveillance-systems/tactical-air-navigation-tacan-/ on Jan. 13, 2015.

Moog Inc., "Distance Measuring Equipment (DME)", 2 pages, Copyright © 2014 Moog Inc., printed from http://www.moog.com/products/navigation-surveillance-systems/distance-measuring-equipment-dme-/ on Jan. 13, 2015.

Galbraith, Gary, "Nautel NDB Systems for the Offshore Market", 2012, 70 pages, Nautel PowerPoint Presentation uploaded from http://www.nautelnav.com/wp-content/uploads/2012/01/Nautel-NDB-Systems-for-the-Offshore-Market.pdf.

Treib, Chris A., Gringas, Paul K., Parsons, Michael W., and Wolfe, David B., "Engineering the All-Weather Antenna Tuning Unit for

(56) References Cited

OTHER PUBLICATIONS

NDGPS Applications", The paper was originally presented in Long Beach, CA on Sep. 14, 2005, 11 pages, EE&L Quarterly, Winter 2006, in particular, see pp. 4 and 5 for relevance.
Reeve, Whitham D., "Application of the UKRAA Very Low Frequency Receiver System", Copyright © 2010 Whitham D. Reeve, 11 pages, Anchorage, Alaska, US; p. 5:2; p. 5.
Chen, John and Tighe, Jennifer, "Auto-Tuning Antenna", Dec. 2011, 56 pages, Electrical Engineering Department, California Polytechnic State University, US, in particular, see p. 1 for relevance; Abstract; p. 1.
PT. Elektrindodaya Pakarnusa, Nautel's NDB (Non Directional Beacon) ND 200S/D product, Copyright © 1996, Last modified Jul. 19, 2001, 3 pages, printed from www.nusaweb.com on Jan. 30, 2002.
Avionics West, Inc., "Automatic Direction Finder", 2 pages, printed from www.avionicswest.com/adFartide.htm on Jan. 30, 2002.
Aerothai Aeronautical Radio of Thailand Ltd., "Aviation Technologies", 5 pages, printed from www.aerothai.com/education.htm on Jan. 30 2002.
Federal Aviation Administration, "Oregon Non-Directional Beacons (NDB)", 2 pages, from www.faa.gov/ats/mmvafss/NDB1.htm on Jan. 30, 2002.
Thales Avionics Ltd., "Technical Publications", 2 pages, printed from www.ravl.co.uk/techpubs/dvor.html on Jan. 30, 2002.
Southern Avionics Company, "Non-Directional Radiobeacons (NDB) and their Place in a Worldwide Navaid System", 2 pages, Copyright © 1996, printed from www.southernavionics.com/sac1g. htm on Jan. 30, 2002.
Fernau Avionics Limited, Home Page and Contact Details of Company, 4 pages, printed from www.fernau.com on Jan. 13, 2009.
Thales Group, Home Page and Contact Details of Company, 19 pages, printed from www.thalesgroup.com on Jan. 14, 2009.
Amplidyne Inc., Home Page and Contact Details of Company, 3 pages, printed from www.amplidyneco.com/telecommunication. html on Jan. 13 & 14, 2009.
Telrad Connegy, Home Page and Contact Details of Company, 6 pages, Copyright © 2007, printed from www.telradusa.com on Jan. 13 & 14, 2009.
Southern Avionics Co., Brochure entitled "Helipad Antenna", 2 pages, published prior to Jan. 1, 2010.
Southern Avionics Co., Brochure entitled "DS Series 25 Watt Locator Transmitter System . . .", 2 pages, published prior to Jan. 1, 2010.
Southern Avionics Co., Brochure entitled "SCARAB—Self Contained Autotune RAdioBeacon 10 to 100 Watt Portable NDB", 2 pages, published prior to Jan. 1, 2010.
Southern Avionics Co., Brochure entitled "SA Series 25/50/100", 4 pages, published prior to Jan. 1, 2010.
Southern Avionics Co., Brochure entitled "SA Series 300/400/500/ 1000", 4 pages, published prior to Jan. 1, 2010.
Southern Avionics Co., Brochure entitled "SD Series", 4 pages, published prior to Jan. 1, 2010.
Southern Avionics Co., Antenna Coupler—PC1000C/3; PC1000M/ 3; PC1000H/3; Manual SD407053, Revision H; 89 pages, dated Feb. 8, 2013; see numbered pp. 1-3 to 4-11.
PCT Notification Concerning Transmittal of International Preliminary Report on Patentability (Chapter I of the Patent Cooperation Treaty) (PCT Rule 44bis.1(c)) for International Application No. PCT/US2014/070001 mailed Jun. 30, 2016 (International Preliminary Report on Patentability issued Jun. 21, 2016), which includes the Written Opinion of the International Searching Authority filed as NPL EE in the Third Supplemental Information Disclosure Statement filed on Jun. 15, 2015 in the present application (19 pages).
Nautel, Specification Sheet for "ATU-HP-TT", Features Preliminary Issue 1.3, http://www.nautelnav.com/solutions/navtex/vector-series-atu-hp-tt-3000w/, (No Date) Printed on May 27, 2016 (2 pages).
Southern Avionics Company, Specification Sheet for "PC-1000C3 Antenna Coupler—Part No. SLF20050/C3". www.southernavionics.com/pc-1000c3. (No Date) Printed on May 27, 2016 (1 page).
Specification for "Upgrade of Differential Global Navigation Satellite (DGNSS) in Jeddah Islamic and Gizan Ports", Annex C.5, numbered pp. 6 of 22 to 12 of 22, in particular, see numbered p. 11 of 22, (No Date) Printed on May 27, 2016 (7 pages).
Page Europa, A General Dynamics Company, "Technical Specification for NDB System: Project No. QD-EH-PTE01-E07-007" cover sheet and numbered p. 1 of 22 to p. 22 of 22, in particular, see numbered p. 20 of 22, Dec. 10, 2012 (23 pages).
U.S. Department of Transportation, Federal Aviation Administration, "Maintenance of Nondirectional Beacons (NDB)" beginning Mar. 6, 1989, see Chapter 3. Standards and Tolerances numbered paragraph p. 9. (44 pages).
Pinks, John R., Chief Engineer Emeritus, "NDB Antennas", Nautel Limited, Dated Oct. 1989, Revised Jun. 2002, and © 2002 Nautel, in particular see numbered pp. 3 of 12 and 4 of 12 (12 pages).
Rhea, Randy, "The Yin-Yang of Matching: Part 2—Practical Matching Techniques," High Frequency Electronics—Apr. 2006, Summit Technical Media (8 pages).

* cited by examiner

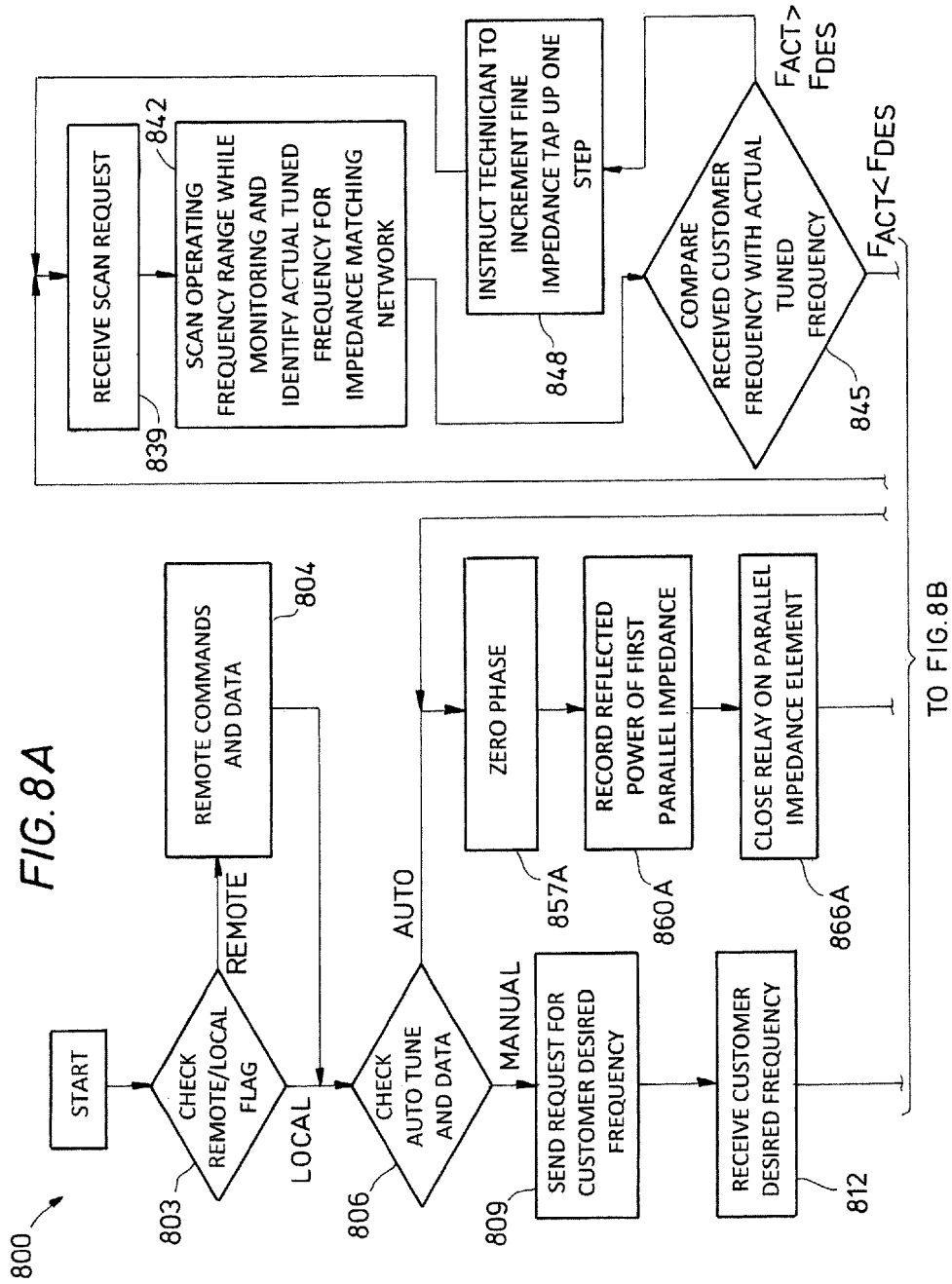

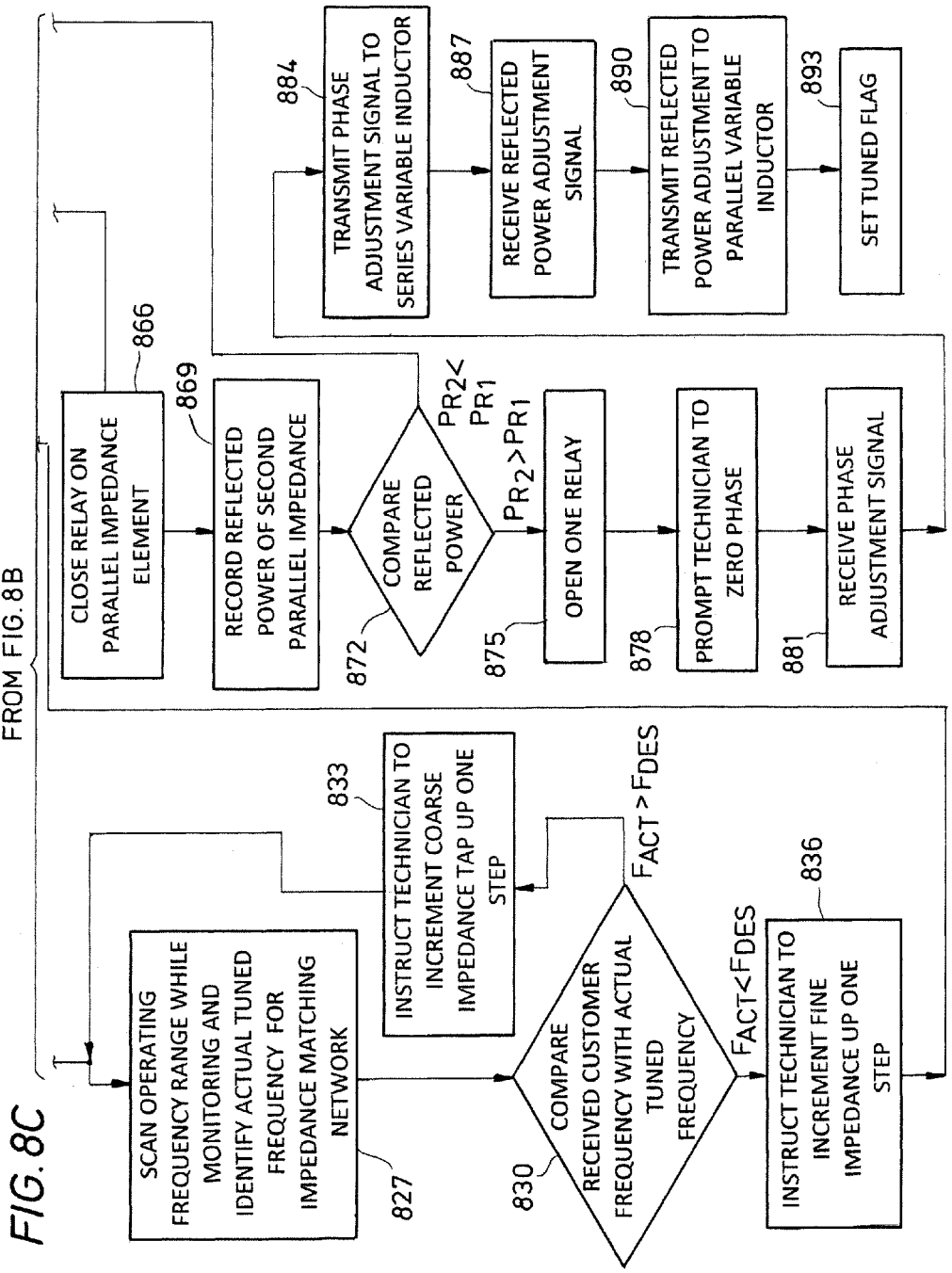

ANTENNA TUNING UNIT

BACKGROUND OF THE DISCLOSURE

1. Field of the Disclosure

This disclosure generally relates to the field of radio communication and, in particular, nondirectional radio beacons.

2. Description of the Art

Radio beacons are used to transmit radio signals as aids to navigation. The signal from a radio beacon is detected by a receiver to allow a location relative to the radio beacon to be determined. Typically, radio beacons transmit on a set frequency and use stationary antennas at a known location. Radio beacons may be directional or non-directional in character. Directional beacons transmit a signal that is stronger in one lateral direction (perpendicular to the length of the antenna) than in another lateral direction. Non-directional beacons transmit a signal that is substantially equal in strength in all lateral directions from the beacon. Non-directional beacons are more commonly used for navigation than directional beacons.

Non-directional beacons transmit a signal equally in all lateral directions, so a receiver placed in any lateral direction from the non-directional beacon will receive approximately the identical signal at the identical strength when positioned at an identical lateral distance from the non-directional beacon. In practice, terrain and other environmental conditions may result in variable signal strength when lateral distances of receivers from the non-directional beacon are identical, even though the antenna of the non-directional beacon is transmitting uniformly in all lateral directions.

The antenna portion of a radio beacon is used to convert electrical signals from a transmitter into electromagnetic radiation, often for the purpose of communication. The transmitter is configured to drive the antenna with an electrical signal within a band of radio frequencies. The design of a specific antenna defines the range of frequencies over which the antenna will operate effectively. The radio frequency spectrum is apportioned by governmental agencies (i.e. Federal Communication Commission) into designated radio frequency bands that may be dedicated for specific uses. Navigational radio beacons in the United States commonly operate in a frequency range of 190 kilohertz to 435 kilohertz, which overlaps with the higher portion of the low-frequency band (30 kilohertz to 300 kilohertz) and the lower portion of the medium frequency band (300 kilohertz to 3 megahertz). The navigation radio beacon frequency range includes frequencies for the Differential Global Positioning System (DGPS) of 283.5 kilohertz to 325.0 kilohertz, and the Global Maritime Distress Network ("NavTex") of 490 kilohertz to 525 kilohertz. Navigational beacons outside the United States may use frequency ranges that have upper ends that extend higher in the medium frequency band, including about 1800 kilohertz in Brazil. Depending on the construction of the antenna, it may be configured for operation at or around one specific frequency, or the antenna may be designed to operate at several different frequencies.

Generally, the effective operating frequency of a radio antenna is related to the signal wavelength. Since the wavelength is the speed of light divided by the frequency, it can be observed that low frequency antennas may be required to handle very large wavelengths. For example, a radio antenna that is designed to be full signal wavelength and operate at 300 kilohertz, would need to be 1000 meters long (300,000,000 meters/second divided by 300,000 cycles/second). As such large antenna lengths present structural and technical difficulties, most antennas are constructed at only a fraction of the signal wavelength. These smaller length antennas may overcome some structural and engineering problems related to size, but they introduce additional tuning difficulties since the antenna length is different from the wavelength. When an antenna is substantially shorter than the signal wavelength, the antenna is referred to as being "electrically short" or "electrically small." An electrically short antenna has a longest dimension that is about or less than one-tenth of the signal wavelength. Typical navigational beacon antennas are about 15 to 60 meters in length.

Antenna Tuning

In most antenna systems, the output impedance of the transmitter and the input impedance of the antenna do not match. Transmitters are often installed for antennas without the antennas' parameters being known prior to installation. An antenna tuning unit is used to match the output impedance of the transmitter (as seen by the antenna) with the input impedance of the antenna. By matching the impedances between the transmitter and the antenna, the amount of input energy converted the radio signal is optimized, and the amount of input energy reflected by the interface with the antenna is minimized (VSWR~1:1). The process of matching of the impedances is called antenna tuning. Maximum power is transferred from the transmitter to the antenna load when the output impedance of the transmitter is the complex conjugate of the input impedance of the antenna.

In order to tune the antenna, an electrical signal is provided from the transmitter. Normal operating power for the transmitter for an antenna, such as a navigational beacon antenna, is substantial enough to result in injury to a radio technician performing the tuning if a fault or failure in the performance of the tuning procedure occurs. To reduce the risk of injury, radio tuning procedures require the radio technicians to reduce the power of the transmitter to a low level for performing the antenna tuning operation. However, injuries may still occur when these procedures are not followed or a malfunction occurs. Once tuned, the antenna will transmit an output signal that is the maximum available based on the frequency and output of the transmitter.

If the transmitter output impedance and the antenna input impedance remain constant, the antenna will not require retuning and configuration of the antenna tuning unit will remain unchanged; however, this is often not the case. Periodic changes in impedances due to environmental changes or relocation of the antenna may require that retuning be performed. While the output impedance of the transmitter is reasonably known due to manufacturing and operating controls, the input impedance of the antenna may vary due to both antenna properties and environmental factors. Antenna properties that may affect input impedance include, but are not limited to, antenna materials and the structural length and shape of the antenna. Environmental factors that may affect input impedance include, but are not limited to, ground resistance, salinity, ground water content, and proximity to standing water.

Matching Networks

The heart of the antenna tuning unit is an impedance matching network. Both tuning and retuning of the antenna involve configuring the impedance matching network between the transmitter and the antenna. The matching network is a circuit that includes impedance elements in series and parallel between the transmitter and the antenna. The impedance elements may comprise circuit components (inductors and capacitors) so that the combination of the output impedance of the transmitter and the impedance of the impedance elements to the matching network is the complex conjugate of the input impedance of the antenna. The impedance elements may be arranged in a variety of configurations, including T-type, Pi-type, and L-type. The configurations are named for the general shape formed by the "legs" or "branches" of the circuit, with each leg representing an impedance element as is known by persons of ordinary skill in the art.

A typical T-type configuration of a matching network includes two inductors in a series branch this divided by a capacitor in a parallel branch. A typical Pi-type configuration of an impedance matching network includes two capacitors in parallel branches on either side of a series branch that includes an inductor. A typical L-type configuration of an impedance matching network includes a series branch with an inductive element (inductor) and a parallel branch with a capacitive element (capacitor), and the parallel branch may be on either side of the series branch.

The impedance elements may be configured to be fixed or variable. Looking more closely at the L-type configuration, for example, the combination of the series inductor and the parallel capacitor will have a resonance frequency, thus the combination will act as a signal filter with the lowest attenuation at the resonance frequency. The inductor and the capacitor may have fixed values, variable values, or there may be one fixed and one variable. In the case of L-type configurations with one or more variable impedance elements, the inductance and/or capacitance can be adjusted. When the inductance/capacitance is adjusted, the resonance frequency will change as well, as will any filtering produced by the impedance matching network. When the input impedance of the antenna load varies, it may be necessary to make adjustments to the impedance matching network in order to maintain maximum signal output.

Maintaining Constant Signal Strength

Another objective of operating a radio beacon is to maintain constant signal strength to the receivers. Even if an impedance matching network is configured to maintain a maximum signal output, the maximum signal output will vary due to changes in the antenna input impedance. In order to maintain constant output signal strength, some radio beacons monitor the amount of electric current delivered to the antenna. By maintaining the amount of electrical current delivered to the antenna at a constant value, generally constant signal strength is provided by the antenna, and it is assumed that a constant electric current delivered to the antenna will result in a consistent signal strength at a specific receiver location. It should be noted that even when the maximum signal output is maintained, the signal strength at the receiver may vary due to atmospheric factors, such as humidity, rain, cloud cover, and solar radiation.

In U.S. Pat. No. 4,951,009, a system is proposed that provides a transmitter-antenna matching network using two variable impedance elements. The system is proposed with L-type, T-type, and Pi-type circuit configurations. At least one of the impedance elements includes a magnetically saturable reactor, such as a tuned transformer with primary and secondary windings wound on a non-linear ferromagnetic core. Both legs of the L-type impedance matching network are shown with inductive and capacitive elements as parts of each of the impedance elements.

In U.S. Pat. No. 4,965,607, a system is proposed that provides a transmitter-antenna matching network using two impedance elements in an L-type circuit configuration. The impedance matching network includes an input series variable inductor and an output parallel variable capacitor.

In U.S. Pat. Pub. No. 2005/0151662, a system is proposed that provides a rescue transceiver that uses received signal strength indication (RSSI) to determine the location of a person buried by an avalanche. The RSSIs of corresponding orthogonal antennas may be compared in order to determine a direction to the signal source, which is located with or near the buried person. The transmitter and the receivers operate independently.

In U.S. Pat. Pub. No. 2013/0033996, a system is proposed that provides a Time Division Multiple Access (TDMA) receiver that uses RSSI feedback. The RSSIs of receiving antennas may be compared to determine which of the antennas is exhibiting superior performance. The system is configured to switch communication from the existing antenna to a superior antenna if it is determined that a superior antenna exists based on the RSSIs.

In U.S. Pat. No. 8,068,798, a system is proposed that provides an auto tuner for antenna matching for an electrically long antenna in a wireless device. The auto tuner uses receiver feedback, transmitter feedback, and current and/or temperature to control a control tuner core. The auto tuner is cycled through predetermined core setups in order to seek out an optimal on-the-air potential regions (coarse), and then a gradient search is performed to fine tune the potentially optimal regions.

In U.S. Pat. Pub. 2007/068512, a system is proposed that provides an integrated spectrum analyzer and vector network analyzer for cellular telephone base stations. The system is configured to transmit signals for testing cellular base stations. The cellular base stations use electrically long antennas and operate in the cellular frequency bands (824 megahertz to about 892 megahertz and 1850 megahertz to about 1990 megahertz).

The above discussed U.S. Pat. Nos. 4,951,009; 4,965,607; and 8,068,798 and U.S. Pub. Nos. 2005/0151662 and 2013/0033996 are hereby incorporated by reference for all purposes in their entirety.

A shortcoming of the systems described above is that none of the prior art proposes a system that uses dual variable inductances without a capacitor in an L-type impedance matching network. Another shortcoming of the systems described above is that none of them use an actual measure of signal strength for controlling antenna output power. Another shortcoming of the systems described above is that none of them incorporate a signal generator into the antenna tuning unit. Another shortcoming of the systems described above is that none of them provide a means of sweeping a frequency range for determining optimal transmission frequency ("sweet spot") for the antenna. Another shortcoming of the systems described above is that none of them provide a means for testing the antenna tuning unit in the factory or in the field without an operational transmitter.

There is a need for an antenna tuning unit that is configured to match impedances between an output from a transmitter and an input to an antenna that does not require a capacitive element in an L-type impedance matching network. Further, there is a need for an antenna tuning unit that is configured to provide feedback control to a transmitter for regulating output power to maintain constant signal strength at a fixed receiver, where the feedback is based on an actual measurement of signal strength, not delivered power to the antenna. Further, there is a need for an antenna tuning system that provides a signal generator for tuning without the presence of an active transmitter. Further, there is a need for an antenna tuning unit configured to sweep the frequency range to determine a "sweet spot" for transmitting. Further, there is a need for an antenna tuning unity configured for built-in-testing in the factory or the field without an operational transmitter.

BRIEF SUMMARY OF THE DISCLOSURE

In aspects, the present disclosure is related to radio communication. Specifically, the present disclosure is related to nondirectional radio beacons.

One embodiment includes an apparatus for tuning a navigational beacon antenna, the apparatus comprising: an impedance matching network comprising: a first end configured to be in electrical communication with a radio transmitter; a second end configured to be in electrical communication with the antenna; a first impedance element electrically connected between the first end and the second end; and a second impedance element electrically connected between the first end and ground; wherein each of the impedance elements comprises a variable inductor and wherein the impedance elements only comprise non-capacitive circuit components. The variable inductors may comprise an air inductor. The apparatus may further comprise: a sensor configured to estimate radio signal strength; and a microcontroller configured to receive the estimated radio signal strength from the sensor and to transmit the estimated radio signal strength to the radio transmitter. The sensor may include a near-field signal strength detector. The apparatus may also include a signal generator configured to transmit a signal through the impedance matching network separate from the radio transmitter. The signal generator may be configured to limit the signal to a power level below a threshold that is harmful to humans. The antenna may be electrically short. The radio transmitter may be configured to operate in frequency band of about 190 kilohertz to about 1800 kilohertz.

Another embodiment includes a system for radio tuning comprising: an antenna; a radio transmitter, and an antenna tuning unit electrically connected between the antenna and the radio transmitter, the antenna tuning unit comprising: an impedance matching network comprising: a first end configured to be in electrical communication with a radio transmitter, a second end configured to be in electrical communication with the antenna; a first impedance element electrically connected between the first end and the second end; and a second impedance element electrically connected between the first end and ground; wherein each of the impedance elements comprises a variable inductor and wherein the impedance elements only comprise non-capacitive circuit components. The variable inductors may each include an air inductor. The system may include a sensor configured to estimate radio signal strength; and a microcontroller configured to receive the estimated radio signal strength from the sensor and to transmit the estimated radio signal strength to the radio transmitter. The system may include a closed loop controller configured to transmit a power adjustment signal to the radio transmitter based on the estimated radio signal strength received from the microcontroller and a target radio signal strength. The sensor may include a near-field signal strength detector. The antenna tuning unit may include a signal generator configured to transmit a signal to the first end. The signal generator may be configured to limit the signal to a power level below a threshold that is harmful to humans. The antenna may be electrically short. The transmitter may be configured to operate in a frequency band of about 190 kilohertz to about 1800 kilohertz.

Another embodiment includes a method for tuning an antenna using an impedance matching network electrically connected between the antenna and a radio transmitter, the impedance network comprising: a first end configured to receive a signal from the radio transmitter; a second end electrically connected to the antenna; a first impedance element comprising at least one variable inductor and electrically disposed between the first end and the second end; and a second impedance element comprising at least one variable inductor and electrically disposed between the first end and an electrical ground; wherein each of the impedance elements comprises a variable inductor and wherein the impedance elements only comprise non-capacitive circuit components; the method comprising: varying a value of at least one of the impedance elements to reduce signal reflection in the signal transmitted from the radio transmitter to the antenna. The antenna may be electrically short. The impedance network may be configured to operate between 190 kilohertz and 1800 kilohertz.

Another embodiment includes an apparatus for maintaining a constant radio signal strength, the apparatus comprising: at least one sensor configured to estimate at least one radio signal strength of a radio signal from an antenna; and a microcontroller configured to receive the at least one estimated radio signal strength and to transmit a signal strength indication to a radio transmitter. The at least one sensor may include a near-field signal strength detector. The at least one sensor may comprise a plurality of sensors, and wherein the signal strength indication is a weighted average of the plurality of radio signal strengths estimated by the plurality of sensors. Each of the plurality of sensors may be disposed at a different location from every other of the plurality of sensors. The weighted average may be based on distances between the antenna and each of the plurality of sensors.

Another embodiment includes a system for maintaining a constant radio signal strength, the apparatus comprising: a radio transmitter configured to transmit a transmitter signal to an antenna; and at least one sensor configured to estimate radio signal strength of a radio signal from the antenna; and a microcontroller configured to receive the estimated radio signal strength from the sensor and to transmit the estimated radio signal strength to the radio transmitter. The system may include a closed loop controller configured to transmit a power adjustment signal to the radio transmitter based on a difference between the estimated radio signal strength and a target radio signal strength. The at least one sensor may comprise a near-field signal strength detector. The at least one sensor may comprise a plurality of sensors, and wherein the observed radio signal strength is a weighted average of the observed radio signal strengths estimated by the plurality of sensors. Each of the plurality of sensors may be disposed at a different location from every other of the plurality of sensors. The weighted average may be based on distances between the antenna and each of the plurality of sensors. The system may include an impedance matching network electrically connected between the radio transmitter and the antenna. The impedance matching network may be an L-type network comprising only noncapacitive impedance elements. The impedance matching network may include two branches with at least one variable inductor on each branch. The system may further comprise a signal generator configured to transmit a signal through the impedance matching network separate from the radio transmitter. The signal generator may be configured to limit the signal to a power level below a threshold that is harmful to humans.

Another embodiment includes a method for maintaining a constant radio signal strength from an antenna powered by a radio transmitter, the method comprising: estimating a signal strength of a radio signal using at least one sensor; and transmitting the estimated signal strength to the radio transmitter. The method may further comprise steps for comparing the at least one estimated signal strength with a target signal strength; and adjusting the input power from the radio transmitter to the antenna based on the comparison. The at least one sensor may include a near-field signal strength detector. The adjustment step may be configured to reduce a difference between the estimated signal strength and a target signal strength. The at least one sensor may comprise a plurality of sensors, and wherein the estimating step comprises using a weighted average of the estimated signal strengths estimated by each of the plurality of sensors. Each of the plurality of sensors is disposed at a different location from every other of the plurality of sensors. The weighted average may be based on distances between the antenna and each of the plurality of sensors.

Another embodiment includes an apparatus for tuning an electrically short antenna, the apparatus comprising: an impedance matching network configured to be electrically connected between a radio transmitter and the antenna; and a signal generator configured to transmit a tuning signal to the antenna through the impedance matching network. The signal generator may be configured to limit the tuning signal to a power level that is below a threshold that is harmful to humans. The signal generator may be configured to sweep an operational range of frequencies between 190 kilohertz and 1800 kilohertz. The impedance matching network may comprise a plurality of branches and each branch comprises a variable impedance element. The apparatus may further comprise: a microcontroller configured to vary an impedance value of at least one of the variable impedance elements to reduce reflected power at an input to the antenna. The impedance elements may not comprise a capacitor. The plurality of branches may be arranged in an L-type configuration. The apparatus may further comprise: a sensor configured to estimate radio signal strength; and a microcontroller configured to receive the estimated radio signal strength from the sensor and to transmit the estimated radio signal strength to the radio transmitter. The sensor may include a near-field signal strength detector.

Another embodiment includes a system for radio tuning, the system comprising: an electrically short antenna; an impedance matching network configured to be electrically connected between a radio transmitter and the antenna; and a signal generator configured to transmit a tuning signal to the antenna. The signal generator may be configured to limit the tuning signal to a power level that is below a threshold that is harmful to humans. The signal generator may be configured to sweep an operational range of frequencies between 190 kilohertz and 1800 kilohertz. The impedance matching network may comprise a plurality of branches and each branch comprises a variable impedance element. The system may further comprise a microcontroller configured to vary an impedance value of at least one of the variable impedance elements to reduce reflected power at an input to the antenna. Each branch may not comprise a capacitor and each variable impedance element comprises a variable inductor. The plurality of branches may be arranged in an L-type network configuration. The system may further comprise: a sensor configured to estimate radio signal strength; and a microcontroller configured to receive the estimated radio signal strength from the sensor and to transmit the estimated radio signal strength to the radio transmitter. The system may further comprise a closed loop controller configured to transmit a power adjustment signal to the radio transmitter based on the estimated radio signal strength received from the microcontroller and a target radio signal strength. The sensor may include a near-field signal strength detector.

Another embodiment includes a method of tuning an antenna, the method comprising: estimating tuned values for impedance elements of an impedance network electrically connected to an electrically short antenna using a transmission from a signal generator to the antenna. The estimating step may comprise: sweeping a range of frequencies with the signal generator; identifying an actual frequency of the impedance network, wherein the actual frequency corresponds to at least one of: i) a lowest reflected power in the impedance network, ii) a zero phase in a signal from the signal generator; iii) a highest current to the antenna, and iv) a lowest current to ground. The method may further comprise: comparing the actual frequency with a desired frequency; and adjusting the values of the impedance elements to the tuned values based on the difference between the actual frequency and the desired frequency. The method may further comprise: comparing the actual frequency with a desired frequency; and providing an indication to an operator, wherein the indication is configured to prompt the operator to adjust the values of the impedance elements to reduce a difference between the actual frequency and the desired frequency. The signal generator may be configured to limit the transmission to power level that is below a threshold that is harmful to humans. The signal generator may be configured to operate in a frequency range of about 190 kilohertz and 1800 kilohertz.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding, reference should be made to the following detailed description of the embodiments, taken in conjunction with the accompanying drawings, in which like elements have been given like numerals, wherein:

FIGS. 8A-8C is a flow chart of a method of tuning an antenna using an antenna tuning unit according to one embodiment.

DETAILED DESCRIPTION OF THE DISCLOSURE

Figure 1:
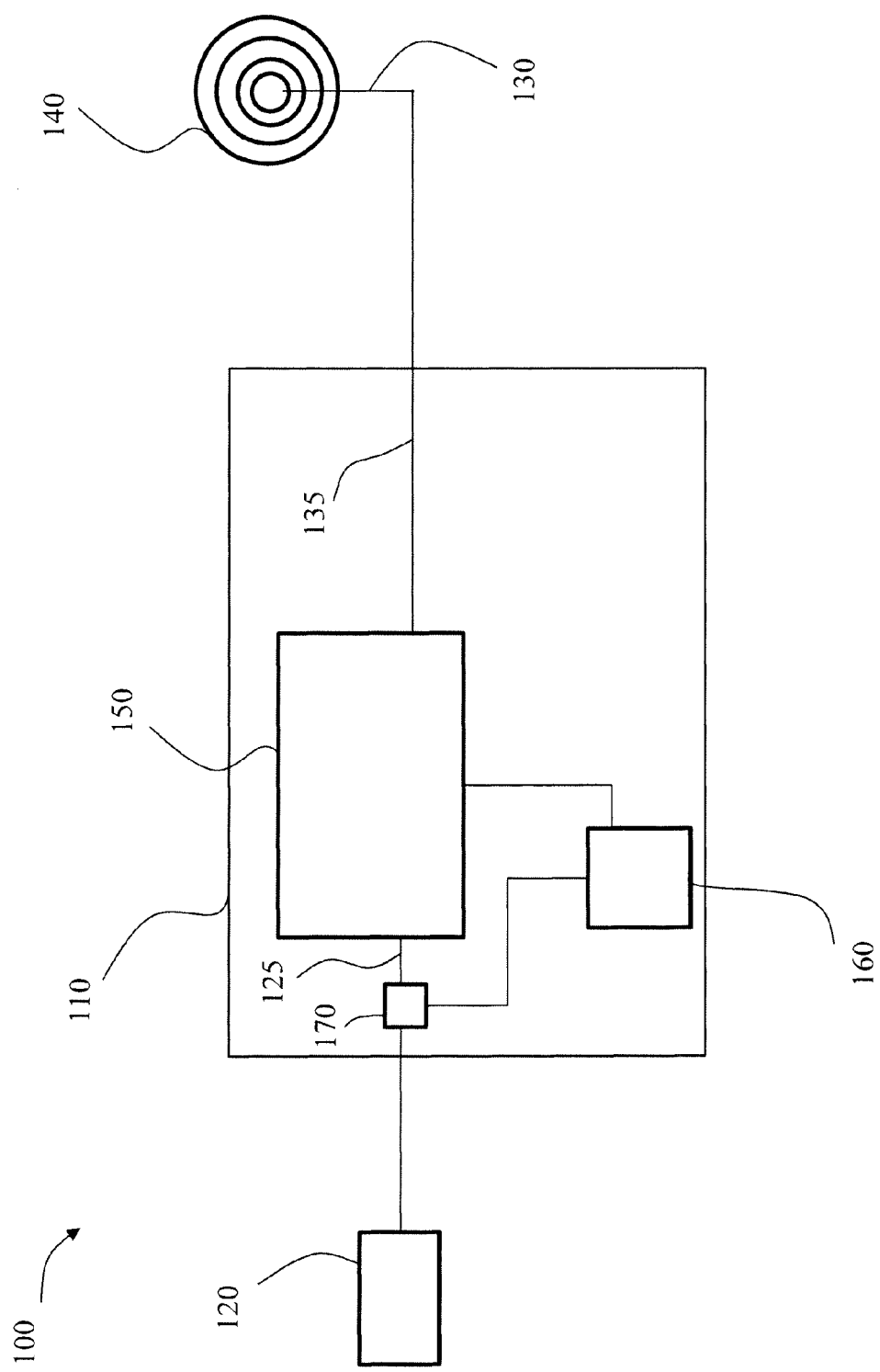
FIG. 1 is a schematic of an antenna matching system with an L-type impedance matching network according to an embodiment.

In aspects, the present invention is related to a radio communication. Specifically, the present invention is related to antenna tuning units for impedance matching between a transmitter and an antenna, wherein the impedance matching network is an L-type configuration with only noncapacitive impedance elements. The present invention is also related to an antenna tuning unit configured to provide feedback to the transmitter regarding field strength of an antenna signal corresponding to the transmitter's output. The present invention is also related to an antenna tuning unit configured for tuning the antenna using a built in signal generator when the transmitter is turned off or not connected. The present invention is susceptible to embodiments of different forms. There are shown in the drawings, and herein will be described in detail, specific embodiments with the understanding that the present invention is to be considered an exemplification of the principles and is not intended to limit the present invention to that illustrated and described herein.

FIG. 1 shows a schematic of an antenna matching system 100 with an antenna tuning unit 110 electrically connected between a transmitter 120 and an antenna 130. The antenna 130 is configured to transmit a radio signal 140 based on the output of the transmitter 120. The antenna tuning unit 110 includes an impedance matching network 150 and a microcontroller 160. The microcontroller 160 includes a processor, a memory, and input/output peripherals. The microcontroller 160 may be realized on a single chip or as a collective of chips working in concert to provide the functionality of a processor, a memory, and input/output peripherals. One non-limiting exemplary microcontroller is a Model No. PIC18F87K22 chip manufactured by Microchip Technology, Inc.

The impedance matching network 150 has a first end 125 configured to receive an input signal from the transmitter 120 and a second end 135 configured to communicate an output signal to the antenna 130. The impedance matching network 150 is configured to provide a complex conjugate of the impedance of the antenna 130 so that the impedance as seen from the transmitter 120 is purely resistive. The antenna 130 may be configured for use as a radio beacon. In some embodiments, the antenna 130 may be between about 15 meters and about 60 meters in length. In other embodiments, the antenna 130 may be electrically short over a range of frequencies from about 190 kilohertz to about 1800 kilohertz. In still other embodiments, the antenna may be electrically short of over a range of frequencies from about 190 kilohertz to about 535 kilohertz. A tuning sensor 170 is electrically connected between the radio transmitter 120 and the impedance matching network 150. The forward-reflected power sensor within 170 is configured to estimate the ratio of reflected power to forward power delivered across the interface between the antenna tuning unit 110 and the antenna 130. The tuning sensor 170 is configured to communicate information regarding the quality of the power being transmitted through the antenna tuning unit 110. The power quality information may include the ratio of forward to reflected power, magnitude of power, and the phase difference between voltage and current. The tuning sensor 170 may be a single device or multiple devices and is configured to communicate power quality information to the microcontroller 160. Suitable tuning sensors 170 may include one or more of: i) a directional coupler and magnitude/phase sensor configured to detect magnitude and phase of the voltage and current and ii) a bidirectional coupled configured to estimate magnitudes of forward and reflected power. A non-limiting example of a directional coupler that may be used in the tuning sensor 170 is a Model No. ZFBDC20-61HP+ manufactured by Scientific Components Corporation under the trademark MINI-CIRCUITS. A non-limiting example of a magnitude/phase sensor that may be used in the tuning sensor 170 is a Model No. AD8302 Network Analyzer on a chip manufactured by Analog Devices, Inc. A non-limiting example of a forward/reflected power sensor that may be used in the tuning sensor 170 is a Series 5010 RF Directional Power Sensor sold under the trademark THRULINE and manufactured by Bird Electronic Corporation. The microcontroller 160 is in electrical communication with one or more actuators 215, 225 (FIG. 2) that are configured to modify the inductive impedance of the impedance matching network 150 in response to commands from the microcontroller 160 based on information from the tuning sensor 170. In some embodiments, a forward current sensor 728 (FIG. 7B) and/or a ground current sensor 718 (FIG. 7B) may provide power quality information to the microcontroller 160, in addition to or as an alternative to aspects of the tuning sensor 170.

Figure 2:
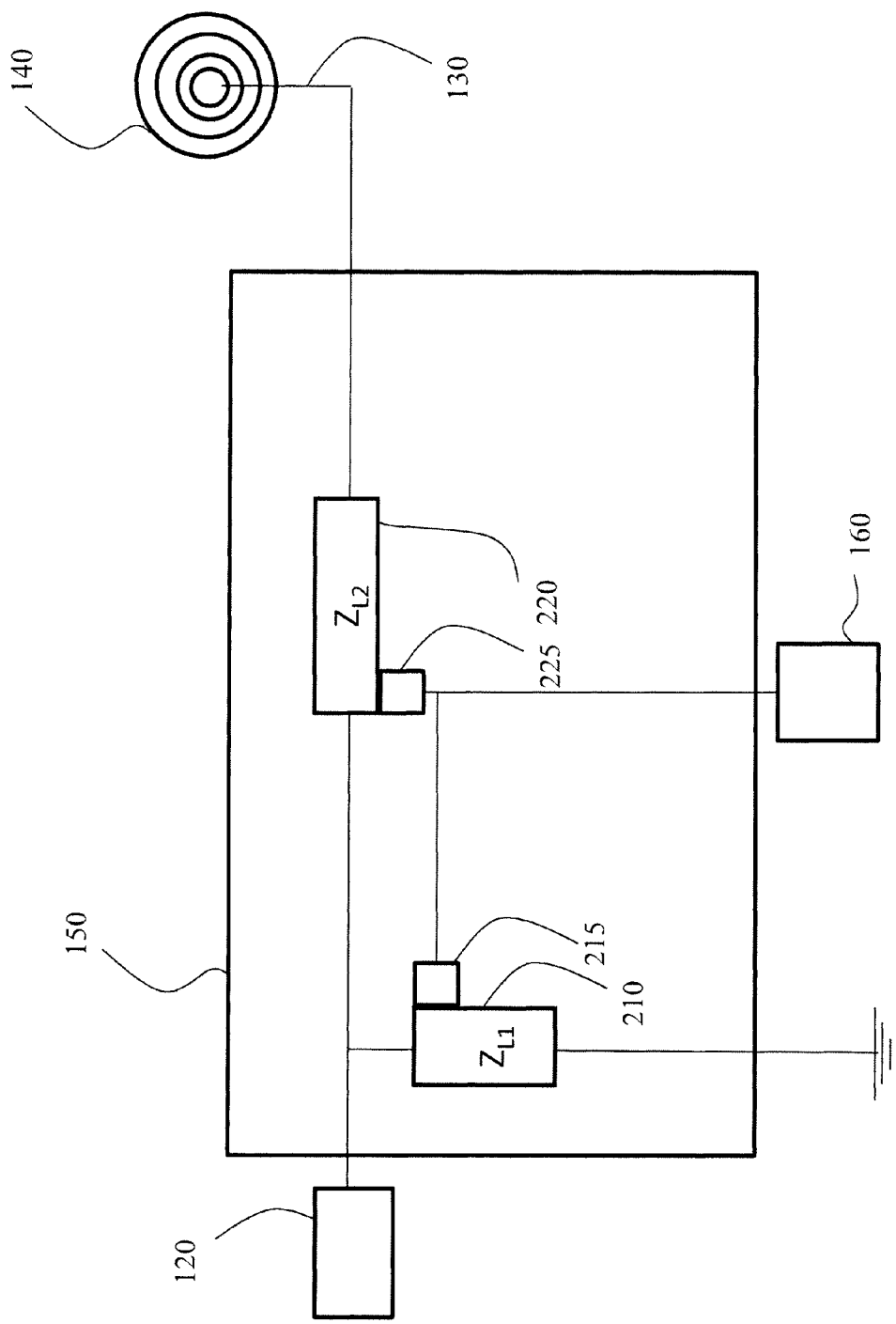
FIG. 2 is a schematic of the L-type impedance matching network from FIG. 1.

FIG. 2 shows a schematic of the impedance matching network 150 from FIG. 1. The impedance matching network 150 includes a first inductive impedance element 210 and a second inductive impedance element 220. The inductive impedance elements 210, 220 are arranged in an L-type configuration such that the first end 125 of the impedance matching network 150 receives a signal from the transmitter 120 and the second end 135 of the impedance matching network 150 outputs the impedance matched signal to the antenna 130. The first inductive impedance element 210 is electrically disposed between the first end 125 and ground, and the second inductive impedance element 220 is electrically disposed between the first end 125 and the second end 135. The inductive impedance elements 210, 220 may each include one or more inductive components; however at least one of the inductive components is a variable inductive component. The inductive components may be configured to provide fixed or variable inductances, so long as the inductive impedance elements 210, 220 have a variable inductance aspect. In one embodiment, each of the inductive impedances 210, 220 includes a fixed inductive component and a variable inductive component. Suitable fixed inductive components include air gap inductors, toroidal type transformers using ferrite cores, variable inductors, tapped inductors, and roller inductors.

The microcontroller 160 is configured to adjust the variable inductive component of at least one of the inductive impedance elements 210, 220. The impedance matching network 150 also includes the actuators 215, 225 which correspond to impedance elements 210, 220. The actuators 215, 225 may includes any actuating means for controlling the inductance provided by the impedance elements 210, 220. Suitable actuators 215, 225 may include, but are not limited to, mechanical, electromechanical, electrical, and piezoelectric actuators.

In some embodiments, where an inductive impedance element 210, 220 includes a variable inductor 712, 722 (See FIG. 7B) and a plurality of fixed inductors 714, 724 (See FIG. 7B), the actuators 215, 225 include a mechanical actuation means for fine adjustment of a variable inductor and a mechanical actuation means for coarse adjustment of the plurality of fixed inductors configured to switch between taps disposed in the plurality of fixed inductors, such as, but not limited to, a motor.

Figure 3:
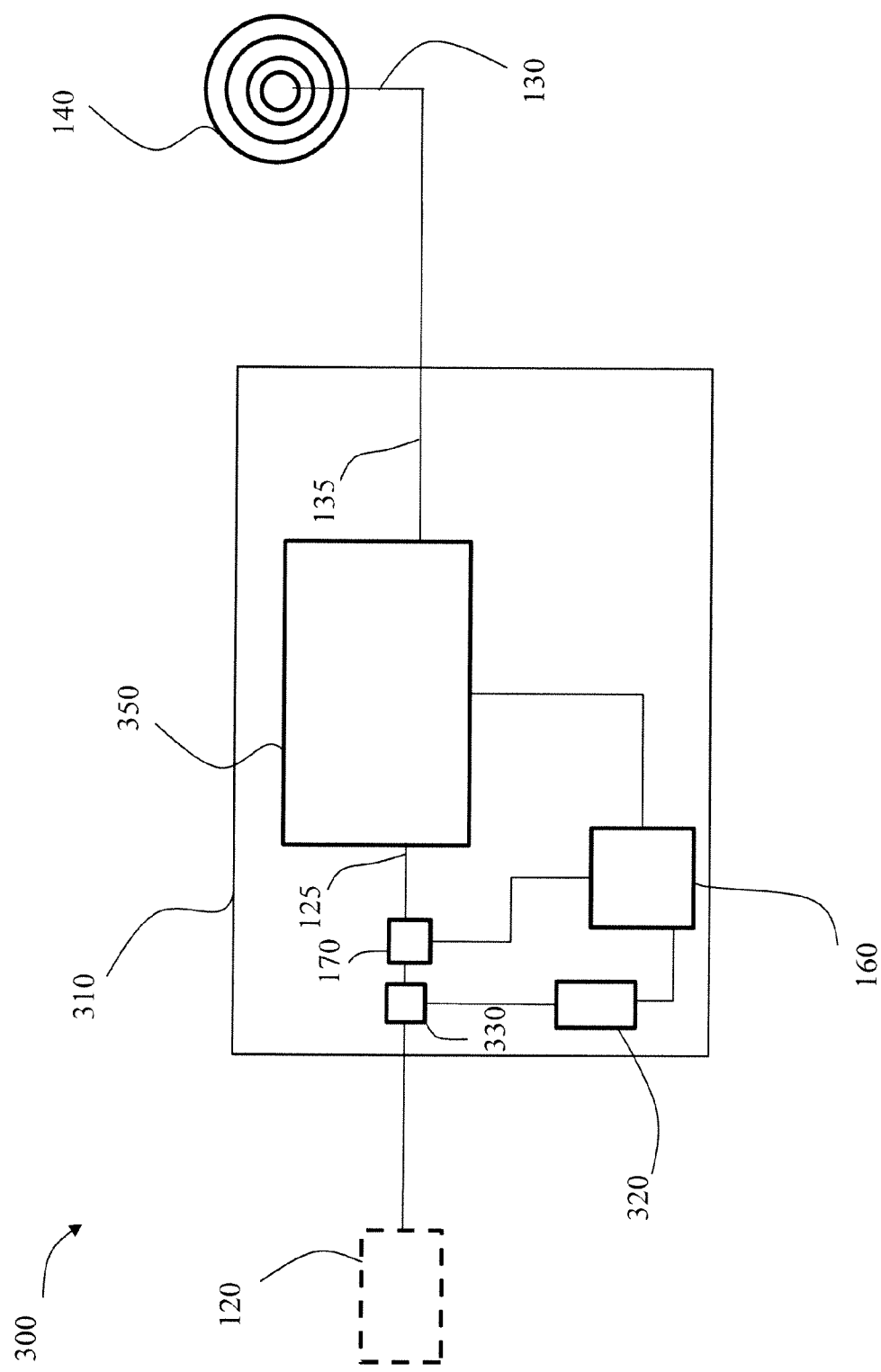
FIG. 3 is a schematic of an antenna matching system with an antenna tuning unit that includes a signal generator according to one embodiment.

FIG. 3 shows a schematic of an antenna matching system 300 with an antenna tuning unit 310 electrically connected between the transmitter 120 and the antenna 130. The antenna tuning unit 310 includes an impedance matching network 350, a signal generator 320, and the microcontroller 160. The signal generator 320 may be in electrical communication with the microcontroller 160 and the first end 125 of the impedance matching network 350 configured to receive an input signal from the transmitter 120. The signal generator 320 is configured to produce a low power signal at one or more frequencies to the antenna 130 though the impedance matching network 350. The signal generator 320 may include a signal generating means for producing an electrical signal over a range of frequencies. The signal generator 320 may be configured to operate over a power range that is not harmful to humans. The signal generator 320 may be configured to deliver an output power below spurious signal levels as defined by local communications regulatory agencies. The signal generator 320 may be configured to operate with an output power over a range of at least 1-20 milliwatts. One non-limiting example of the signal generator 320 is an AD9834 Direct Digital Synthesizer manufactured by Analog Devices, Inc. The microcontroller 160 may control the frequency of the signal generator and sweep a range of frequencies with the signal generator 320 to locate an optimum frequency (a "sweet spot") for the impedance matching network 350 in its current configuration. The "sweet spot" is the radio frequency of the transmitter for a specific impedance, provided by the impedance matching network, where the VSWR is at its lowest point and the phase angle of the power is zero. As would be understood by a person of ordinary skill in the art, an impedance of the impedance matching network, when electrically coupled to an antenna, will have a unique frequency where the VSWR is at its lowest point and the phase angle of the power is zero.

The signal generator 320 may be configured to sweep part or all of the operational range of the transmitter 120. In some embodiments, the sweep of frequencies may be controlled by the microcontroller 160. The microcontroller 160 may also be configured to control the impedance of the impedance matching network 350. The signal generator 320 may send a signal to the impedance matching network 350 while the transmitter 120 is turned "off" or disconnected from the system 300. The transmitter 120 is shown with a dashed border in FIG. 3 because the transmitter 120 is optional for tuning of the antenna 130 since the signal generator 320 may provide an input signal for the impedance matching network 350. A switching device 330, suitable for use in an antenna tuning unit, may be configured to toggle between the first end 125 being connected to the transmitter 120 and the first end 125 being connected to the signal generator 320. A suitable switching device for the switching device 330 may be a coaxial relay, such as a Model No. CX-600N coaxial relay, manufactured by Toyo Tsusho Co., Ltd. (D/B/A "Tohtsu"). Thus, the signal generator 320 may be used to tune the antenna 130 even without the transmitter 120 being present.

In one embodiment, a desired sweet spot may be selected by a user and entered into the microcontroller 160. The microcontroller 160 may have the desired sweet spot stored in onboard memory or retrieve the desired sweet spot information from another memory in communication with the microcontroller 160. During the tuning process, the desired sweet spot may be compared with the actual sweet spot of the antenna tuning unit 310/antenna 130 combination.

Figure 4:
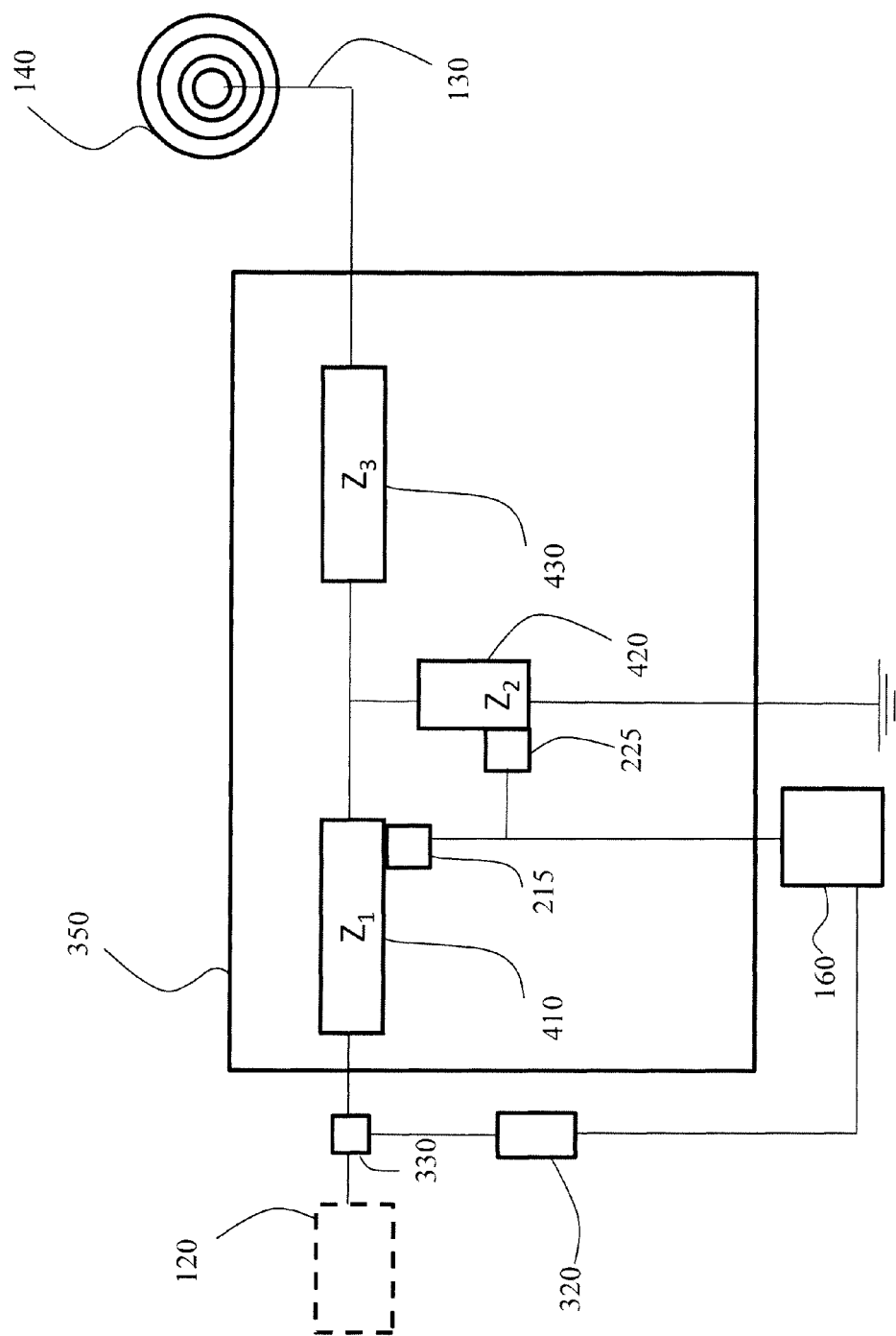
FIG. 4 is a schematic of the impedance matching network from FIG. 3.

FIG. 4 shows a schematic of the impedance matching network 350 from FIG. 3. The impedance matching network 350, as shown, includes three impedance elements 410, 420, 430. The impedance elements 410, 420, 430 are shown in a T-type configuration; however, any suitable configuration known to a person of ordinary skill in the art may be used, including an L-type configuration and a Pi-type configuration. Depending on the network configuration used, there may be as few as two impedance elements 410, 420, 430 in the impedance matching network 350. Thus, the impedance matching network 150 (FIG. 1) is a subset of the suitable configurations for impedance matching network 350. The impedance elements 410, 420, 430 may be capacitive or inductive as would be understood by a person of ordinary skill in the art. The impedance elements 410, 420, 430 may each be either fixed, variable, or both. The variable aspects of the impedance elements 410, 420, 430 may be controlled by the microcontroller 160. As shown, the microcontroller 160 controls the impedance elements 410, 420 by sending a control signal to one or more of the actuators 215, 225. While only the impedance elements 410, 420 are shown with actuator control; this is exemplary and illustrative only, as any number of impedance elements 410, 420, 430 may be equipped with actuators 215, 225 and controlled by the microcontroller 160. In one embodiment, the impedance elements 410, 430 are inductors and the impedance element 420 is a capacitor, where suitable inductors for impedance elements 410, 430 are the inductive impedance components that may be used in the impedance elements 210, 220. When using a capacitive component in the impedance element 420, the impedance element 420 may comprise any suitable capacitive electrical circuit component known to a person of ordinary skill in the art, including, but not limited to, fixed or variable vacuum capacitors and high current mica capacitors.

Figure 5:
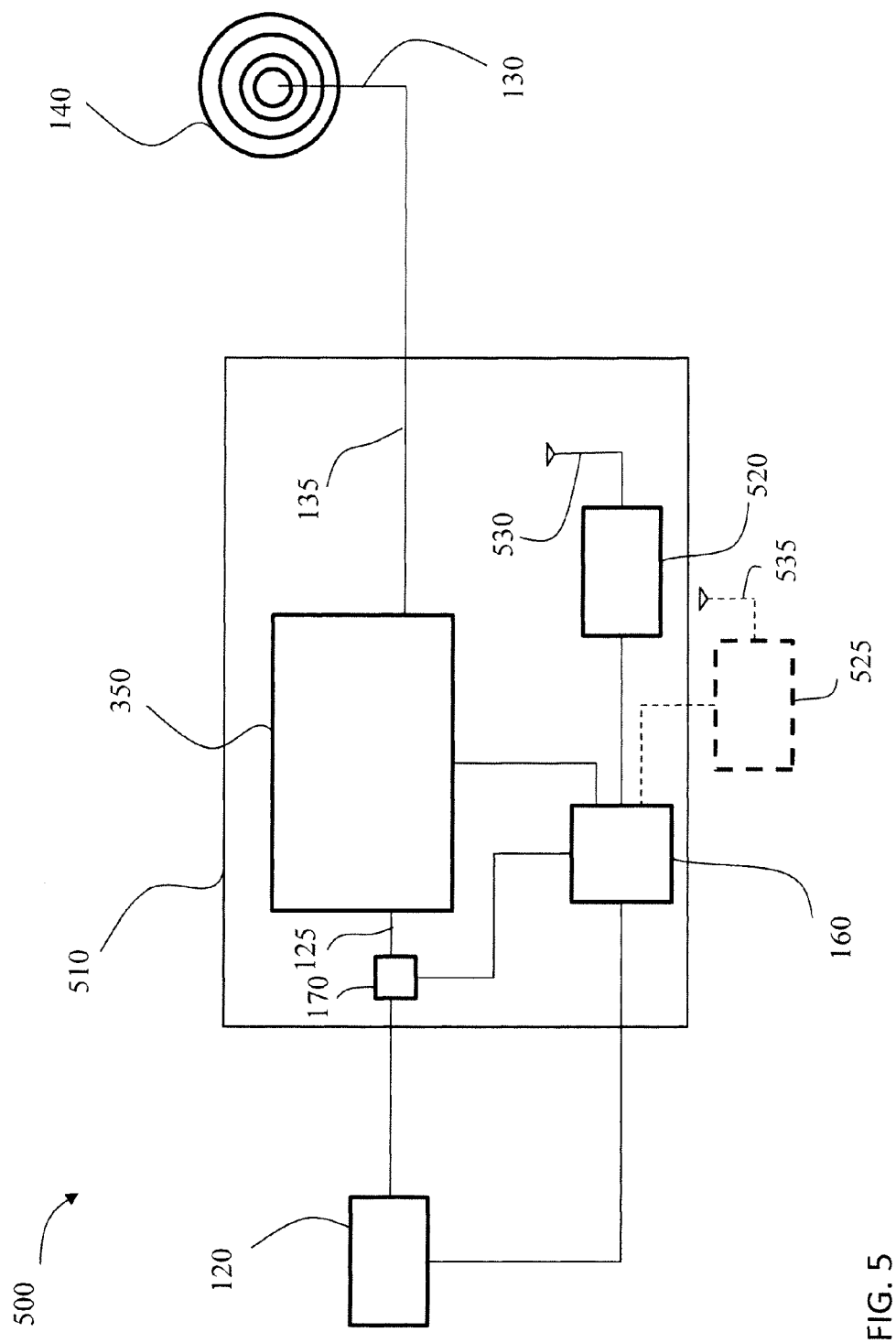
FIG. 5 is a schematic of an antenna matching system with an antenna tuning unit that includes a near-field detector according to one embodiment.

FIG. 5 shows a schematic of an antenna matching system 500 with an antenna tuning unit 510 electrically connected between the transmitter 120 and the antenna 130. The antenna tuning unit 510 includes the impedance matching network 350, the microcontroller 160, and a near-field signal strength detector 520. The near-field signal strength detector 520 is configured to estimate the strength of the signal 140 from the antenna 130. An antenna 530 may be electrically connected to the near-field signal strength detector 520 to augment reception of the radio signal 140. The estimated near-field strength is then compared with a target field strength value by the microcontroller 160. The microcontroller 160 is configured to transmit a signal strength indication to the transmitter 120.

In one embodiment, the signal strength indication may be the estimated near-field signal strength. In another embodiment the signal strength indication may include a signal strength difference based on the comparison of the estimated near-field strength and a target field strength value. The signal strength indication may include an order to the transmitter to provide an indication to inform a technician that the output power of the transmitter 120 should be increased/decreased. One non-limiting indication may include the illumination of one or more lights. Other suitable indications may include audio tones, displayed text, etc. The instructions may include an order to the transmitter to increase/decrease power output to the antenna 130. Since the near-field signal strength is at is maximum when the system 500 is tuned to have the least reflected power and highest antenna current, the near-field signal strength detector 520 may be used to supplement or as an alternative for the tuning sensor 170.

In one embodiment, the target field strength value may be stored in the transmitter 120 and retrieved by the microcontroller 160. In another embodiment, the target field strength value may be stored in the antenna tuning unit 510. In yet another embodiment, the target field strength value may be retrieved by the microcontroller 160 from an external data source over a communication channel. In some embodiments, the estimated near-field strength is received by the microcontroller 160 and transmitted to the transmitter 120, and the transmitter 120 may be configured to perform the comparison with a target field strength value.

In one embodiment, the system 500 may include an optional, additional near-field signal strength detector 525 and corresponding additional near-field antenna 535. The additional near-field signal strength detector 525 may be configured to estimate the field strength of the radio signal 140 at a different location than the near-field signal strength detector 520. The estimated near-field signal strengths from the signal strength detectors 520, 525 may be received by the microcontroller 160. The microcontroller 160 may be configured to communicate a signal strength indication based on a weighted average of the individual near-field signal strengths. The weighted average may be based on the positions of the near-field signal strength detectors 520, 525 relative to the antenna 130.

Figure 6:
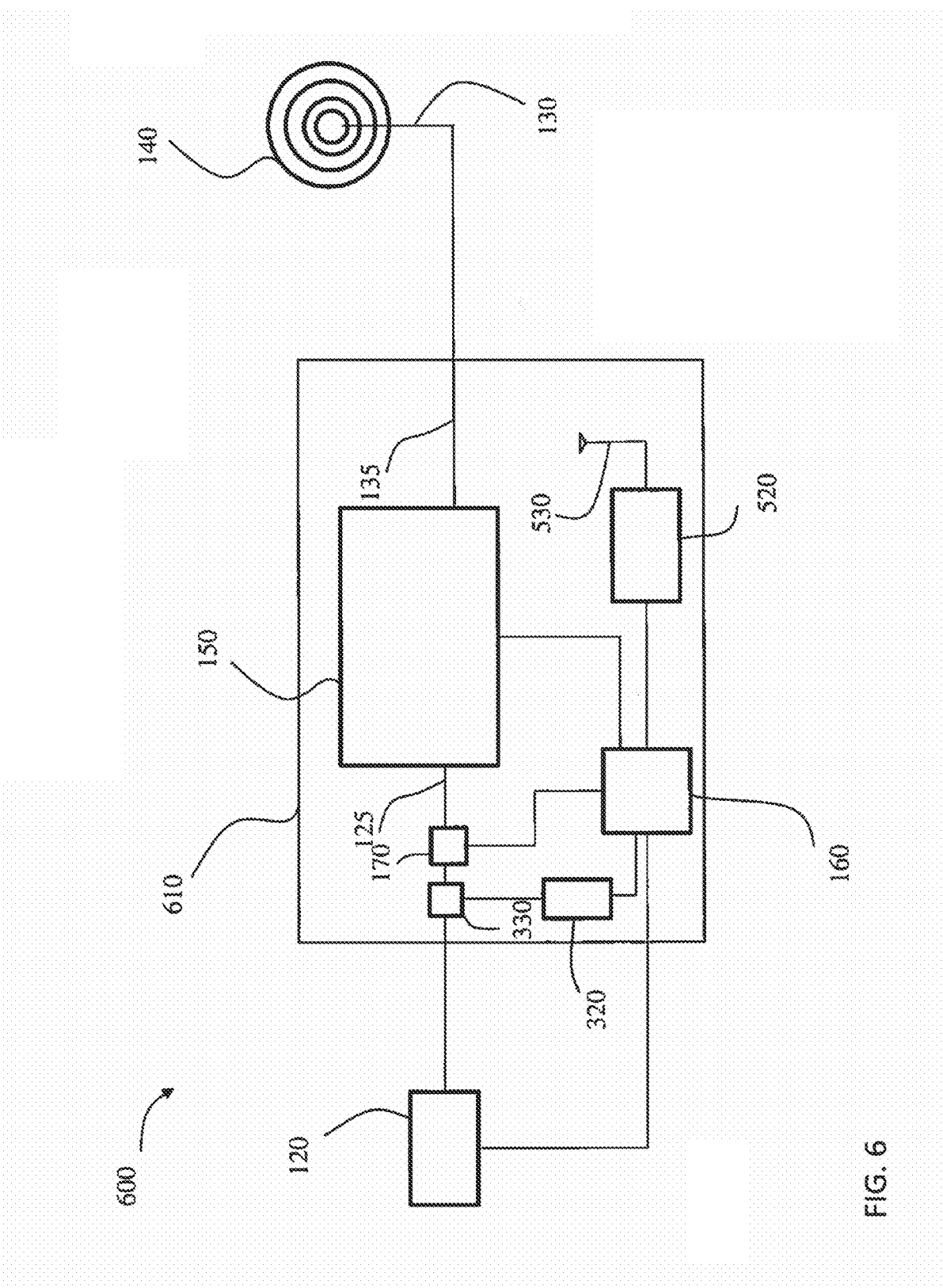
FIG. 6 is a schematic of an antenna matching system with an antenna tuning unit that includes an L-type impedance matching network, a signal generator, and a near-field detector according to one embodiment.

FIG. 6 shows a schematic of an antenna matching system 600 with an antenna tuning unit 610 electrically connected between the transmitter 120 and the antenna 130. The antenna tuning unit 610 includes the impedance matching network 150, the microcontroller 160, the signal generator 320, and the near-field signal strength detector 520. As shown, the microcontroller 160 is configured to control the signal generator 320, to receive an estimated near-field signal strength from the near-field signal strength detector 520, and to communicate the estimated near-field signal strength to the transmitter 120.

Figure 7A:
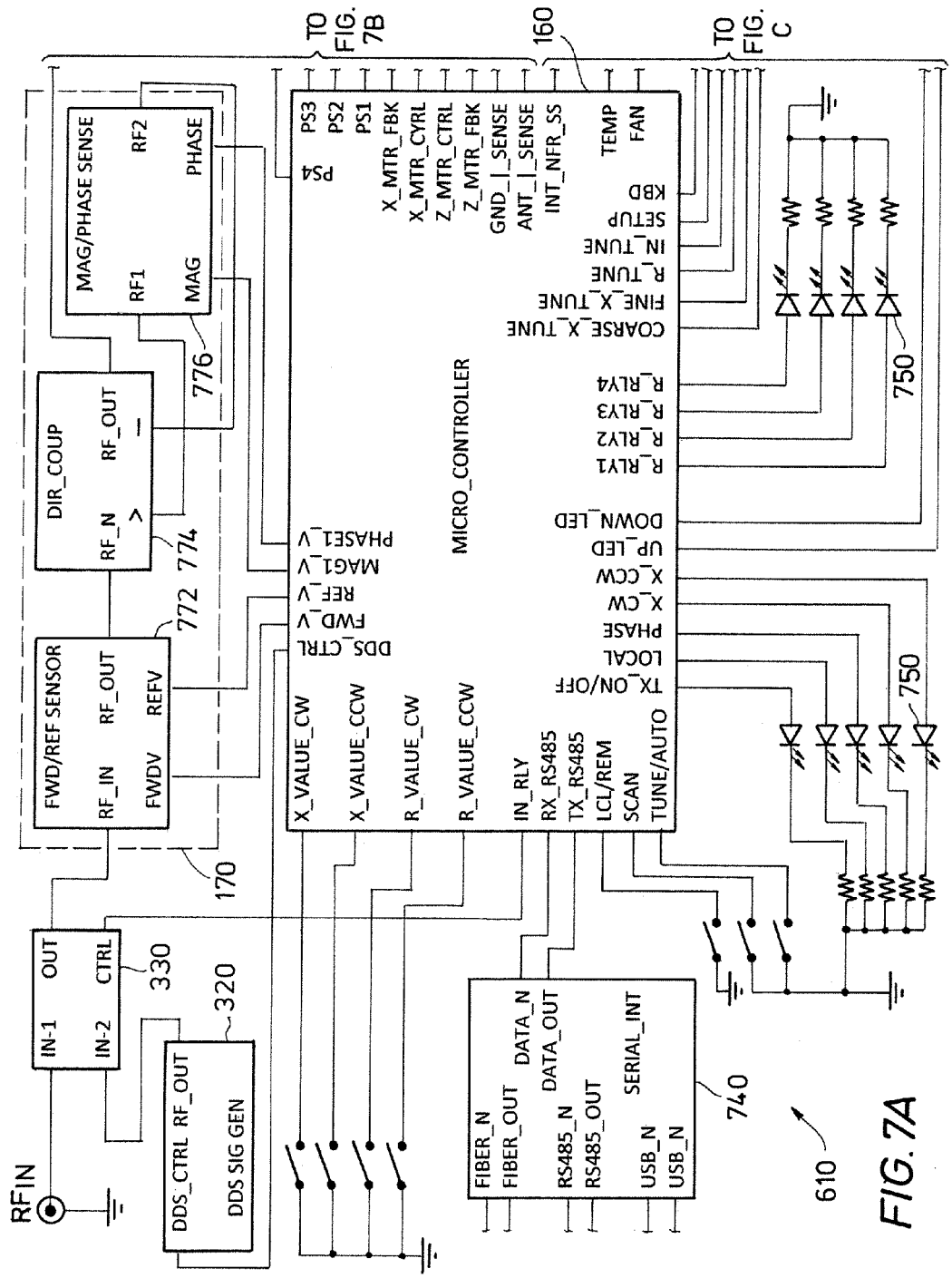
FIGS. 7A-7C is a circuit diagram of the antenna tuning unit from FIG. 6.
Figure 7B:
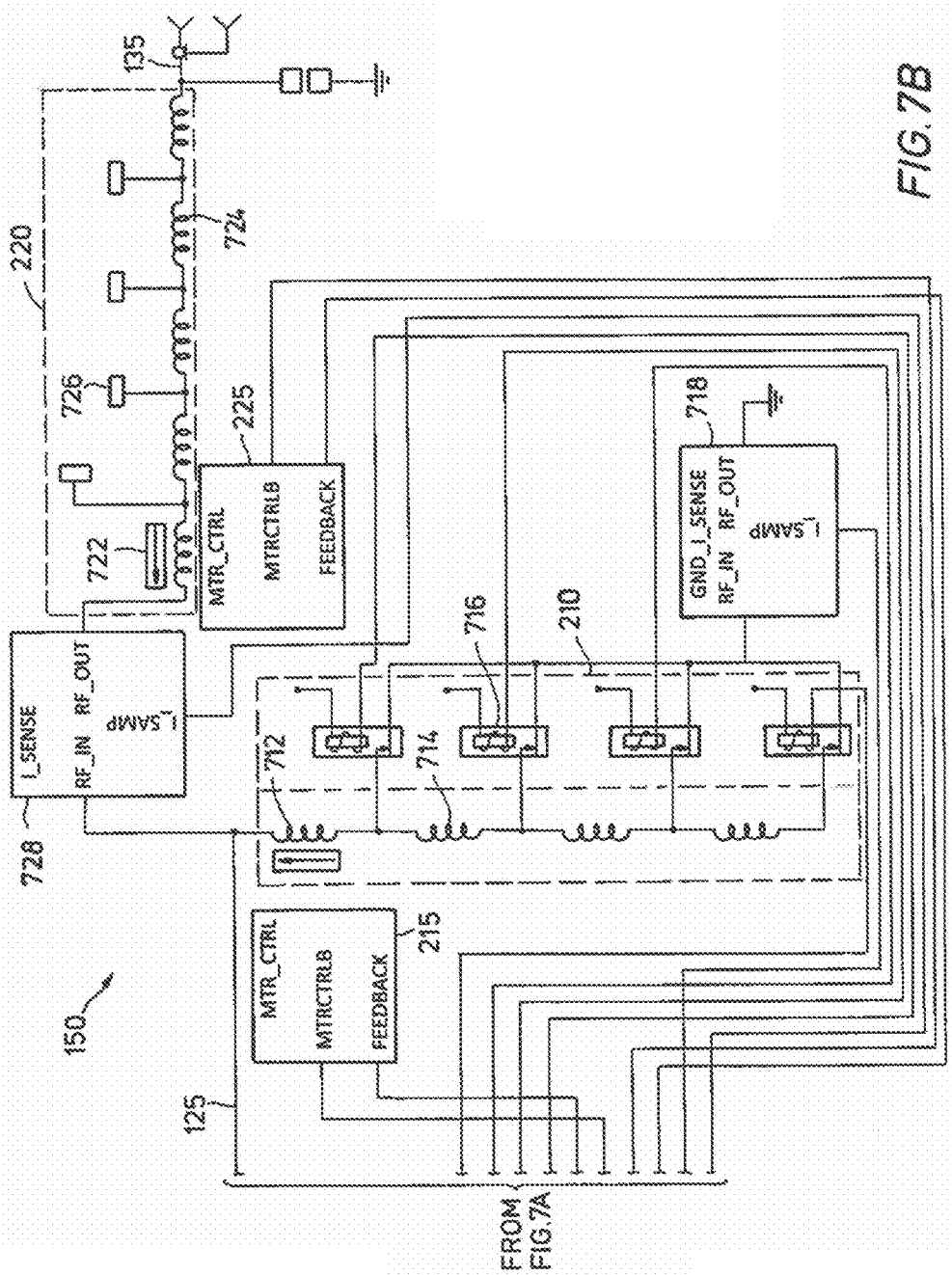
Figure 7C:
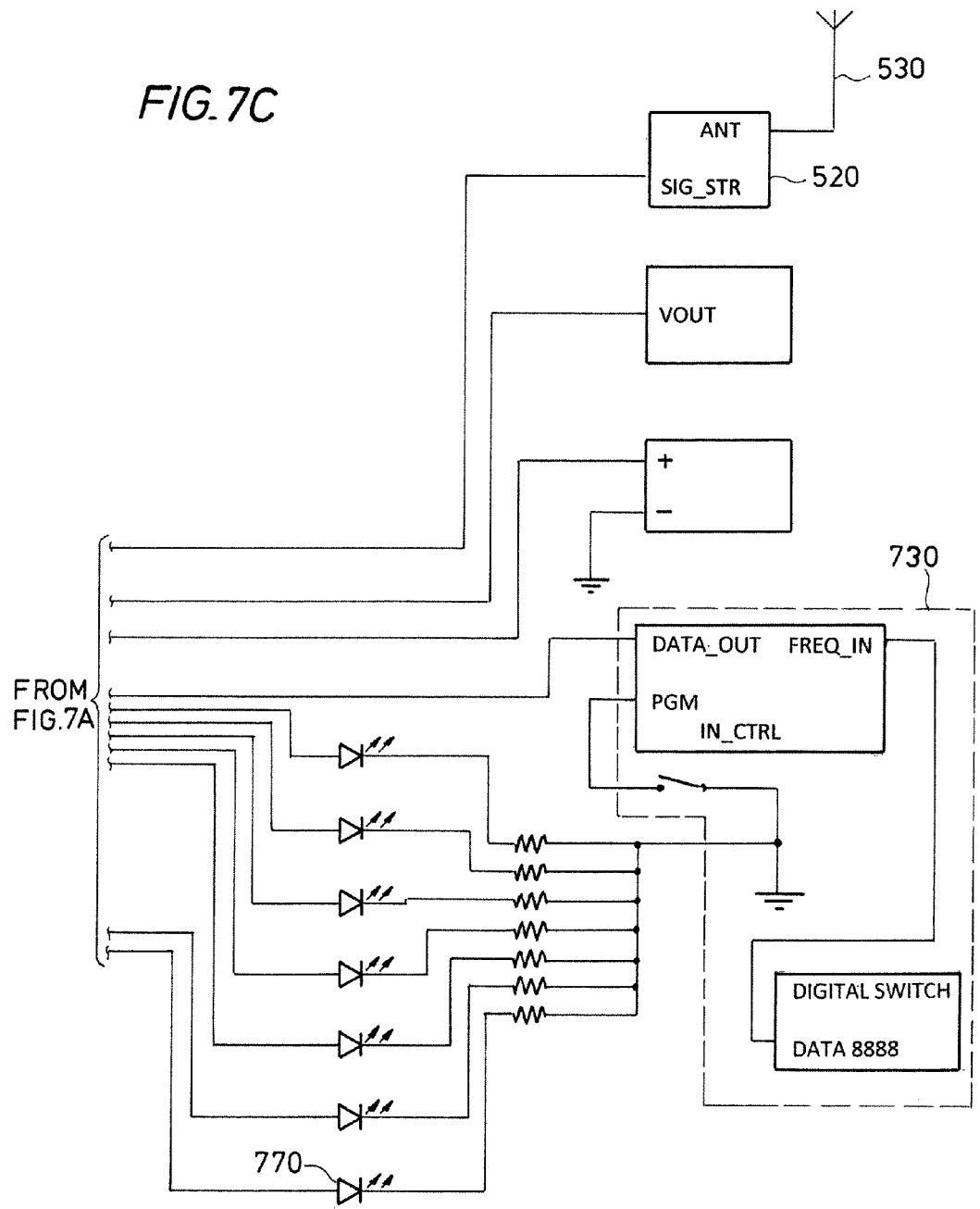

FIGS. 7A, 7B, and 7C show a circuit block diagram of the antenna tuning unit 610. A desired frequency (such as a target frequency) may be entered and stored in user interface 730. The desired frequency may be uploaded into the microcontroller 160. As shown, the antenna tuning unit 610 includes a tuning sensor 170 between the switching device 330 and the impedance matching network 150. The tuning sensor 170 includes a forward/reflected power sensor 772, a directional coupler 774, and a magnitude/phase sensor 776 in communication with the directional coupler 774. The outputs of the forward/reflected power sensor 772 and the magnitude/phase sensor 776 are in electrical communication with the microcontroller 160.

The inductive impedance element 210 includes the variable inductor 712, a plurality of fixed inductors 714, and a plurality of relays 716. The variable inductor 712 may be varied by the actuator 215, which is controlled by the microcontroller 160. The plurality of relays 716 are configured to switch in/out fixed inductors 714 of the inductive impedance element 210. The plurality of relays 716 may be controlled by the microcontroller 160. The fixed inductors 714 may have uniform or non-uniform inductance values. Similarly, the inductive impedance element 220 includes the variable inductor 722, a plurality of fixed inductors 724, and a plurality of taps 726.

The variable inductor 722 may be varied by the actuator 225, which is controlled by the microcontroller 160. The plurality of taps 726 is configured to switch in/out fixed inductors 724 of the inductive impedance element 220. The fixed inductors 724 may have uniform or non-uniform inductance values. The relays 716 may be configured as a means for the microcontroller 160 to adjust the impedance of the first inductive impedance element 210, and the taps 726 may be configured to provide a means for a technician to physically adjust the inductance of the second impedance element 220; however, this is exemplary and illustrative only, as it is contemplated that either of the impedance elements 210, 220 may be configured for control by physical adjustment of taps or control signals to relays.

A forward current sensor 728 may be disposed in the current path of the second inductive impedance element 220. The forward current sensor 728 may be configured to estimate the current being transmitted to the antenna 130 through the second inductive impedance element 220. A ground current sensor 718 may be disposed in the current path of the first inductive impedance element 210. The ground current sensor 718 may be configured to estimate the current being transmitted through the first inductive impedance element 210. The current sensors 718, 728 are configured to communicate the current information to the microcontroller 160.

The microcontroller 160 may also receive a desired operating frequency from a frequency input 730. The frequency input 730 may include a user interface and memory for a technician to set a desired operating frequency. The microcontroller 160 may also send and receive information over a communications interface 740. The communications interface 740 may include an RS-485 connection, RS-232 connection, or other suitable interface as understood by a person of ordinary skill in the art. The microcontroller 160 may relay information to the technician at the antenna tuning unit 610 through a set of indicators 750. Suitable indicators include lights, such as LEDs, and a digital readout. The indicators 750 may include, but are not limited to, lights and liquid crystal displays. The indicators 750 may be configured to i) instruct a technician to adjust a tap up/down, ii) instruct a technician to adjust a control for a variable inductor or relay, and iii) provide an alert when the voltage and current are in phase.

Figure 8B:
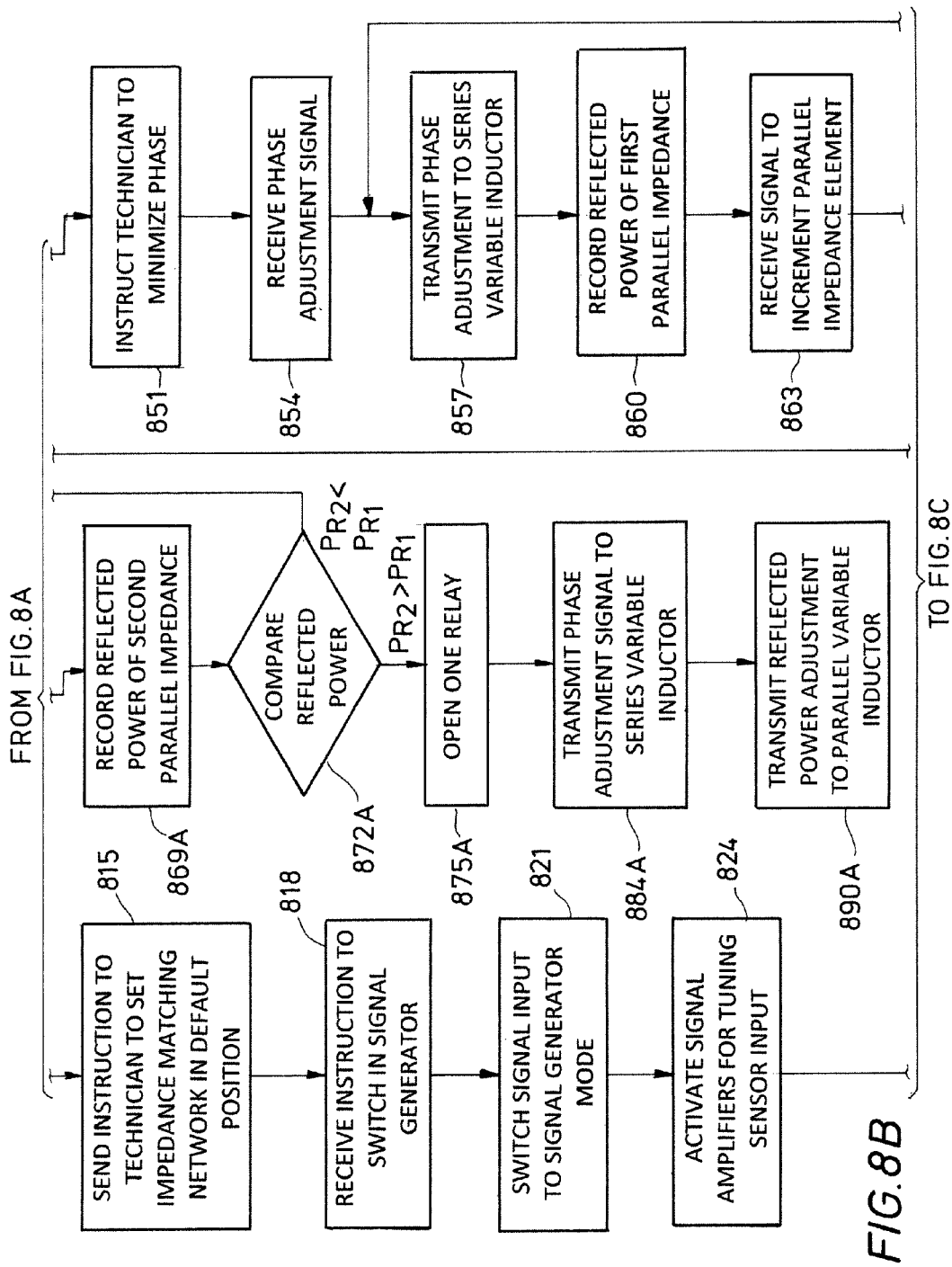

FIGS. 8A, 8B, and 8C shows a flow chart 800 of a method for tuning the antenna 130 according to one embodiment. In step 803, the microcontroller 160 may receive an instruction through the communication interface 740 or from a local switch (not shown) to accept tuning inputs at the antenna tuning unit 610. In step 804, the instructions are coming from a remote site. In step 806, the microcontroller 160 receives an instruction to operate in manual or automatic tuning mode. This step may include checking for a "tuned" flag, which is set if the antenna tuning unit 610 has already been tuned in its present installation.

Manual Tuning—Coarse

In step 809, when manual tuning mode is selected, the microcontroller 160 prompts the operator (technician or remote site) for a desired operating frequency. The request may be sent to one or more indicators 750 configured to prompt or alert the operator that the antenna tuning unit 610 is waiting for the input of the desired operating frequency of the customer. The desired operating frequency may be input at the frequency input 730 or over the communication interface 740. In step 812, the microcontroller 160 receives the desired operating frequency. In step 815, microcontroller 160 transmits instructions to set the taps 726, relays 716, and variable inductors 712, 722 may be set to pre-selected starting positions. In step 818, the microcontroller 160 receives an instruction to switch the signal source from the transmitter 120 to the signal generator 320. Steps 812, 815, and 818 may be performed in any order. In step 821, the microcontroller 160 transmits a signal to switching device 330 to connect electrical communication between the signal generator 320 and the first end 125. In step 824, signal amplifiers (optional and not shown) in the microcontroller 160 may be activated to boost the signals from the tuning sensor 170. In step 827, the signal generator 320 sweeps the operating frequency range at the request of the microcontroller 160. During the frequency sweep, the microcontroller 160 is configured to record the actual frequency at which the antenna tuning unit is "tuned". As shown in the FIG. 8, the "tuned" actual frequency may be the frequency at which the reflected power detected by the forward/reflected bidirectional coupler 772 is at a minimum. Use of the lowest reflected power to determine the actual frequency is exemplary and illustrative, as the actual frequency may be determined using other measures, which coincide with the lowest reflected power, including but not limited to, the highest forward current in the second impedance element 220, a zero phase angle between voltage and current, the lowest current to ground in the first impedance element 210, and the lowest VSWR. Any of these alternatives for identifying the actual frequency may be used in place of lowest reflected power throughout method 800. In step 830, the actual frequency is compared with the desired operating frequency. In step 833, when the actual frequency is greater than the desired frequency, the microcontroller 160 sends a signal to the indicators 750 to communicate to the technician an instruction to increase the taps 726 by one coarse increment or step.

Manual Tuning—Fine

In step 836, when the actual frequency is lower than the desired frequency, the microcontroller 160 sends a signal to the indicators 750 to communicate to the technician to decrease the taps 726 by one fine increment. In step 839, the microcontroller 160 receives an instruction to scan the operating frequency range and transmits the instruction to the signal generator 320. In step 842, the signal generator 320 sweeps the operating frequency range. During the frequency sweep, the microcontroller 160 is configured to record the frequency of the lowest reflected power detected by the forward/reflected bidirectional coupler 772, which is the actual frequency for the antenna tuning unit. In step 845, the actual frequency is compared with the desired operating frequency. In step 848, when the actual frequency is greater than the desired frequency, the microcontroller 160 sends a signal to the indicators 750 to communicate to the operator an instruction to increase the variable inductor 722 by one fine increment.

Manual Tuning—Extra Fine

In step 851, when the actual frequency is less than the desired frequency, the microcontroller 160 transmits an instruction to the operator to zero the phase of the signal from the signal generator 320. The phase is estimated by the magnitude/phase sensor 776 for the power from the signal generator 320. In step 854, the microcontroller 160 receives an input from the operator for adjusting the phase to zero. In step 857, the microcontroller 160 transmits an instruction to actuator 225 to vary the second variable inductor 722 to adjust the impedance in the second impedance element 220 (series impedance element) until the phase is about zero. In step 860, when the microcontroller 160 receives a zero phase estimate from the magnitude/phase sensor 776, the microcontroller 160 records the reflected power level estimated by the forward/reflected bidirectional coupler 772. In step 863, the microcontroller receives an instruction from the operator to increment the impedance of the first impedance element 210 (parallel impedance element). In step 866, the microcontroller 160 transmits an instruction to close one of the relays 716, which will increase the number of closed relays 716 by one. In step 869, the microcontroller 160 records the reflected power level again. In step 872, the microcontroller compares the reflected power levels before and after the closing of the relay 716. If the reflected power level after the relay 716 is closed is less than the reflected power level before the relay 716 was closed the method 800 proceeds back to the step 857. In step 875, when the reflected power after the relay 716 closure is greater than the reflected power before the closure of the relay 716, the microcontroller 160 transmits an instruction to open one relay 716. In step 878, the microcontroller 160 transmits a signal to the indicators 750 to instruct the operator to zero the phase. In step 881, the microcontroller 160 receives a signal to change the first impedance 210. In step 884, the microcontroller 160 sends a signal to the actuator 225 to change the impedance of the variable inductor 722. In step 887, the microcontroller 160 receives a reflected power estimate. In step 890, the microcontroller 160 sends a signal to the actuator 215 to change the impedance of the variable inductor 712 to minimize the reflected power level. In step 893, the antenna tuning unit 610 is tuned and the "tuned" flag is set.

Automatic Tuning

If the "tuned" flag is set, then the method 800 will proceed from step 806 to step 857A. In step 857A, the microcontroller 160 transmits an instruction to the actuator 225 of the variable inductor 722 to adjust the impedance in the second impedance element 220 until the phase is about zero. In step 860A, when the microcontroller 160 receives a zero phase estimate from the magnitude/phase sensor 776, the microcontroller 160 records the reflected power level estimated by the forward/reflected bidirectional coupler 772. In step 866A, the microcontroller 160 transmits an instruction to close one of the relays 716, which will increase the number of closed relays 716 by one. In step 869A, the microcontroller 160 records the reflected power level again. In step 872A, the microcontroller compares the reflected power levels before and after the closing of the relay 716. If the reflected power level after the relay 716 is closed is less than the reflected power level before the relay 716 was closed the method 800 proceeds back to the step 857. In step 875A, when the reflected power after the relay 716 closure is greater than the reflected power before the relay 716 closure, the microcontroller 160 transmits an instruction to open one relay 716. In step 884A, the microcontroller 160 sends a signal to the actuator 225 to change the impedance of the variable inductor 722. In step 890A, the microcontroller 160 receives a reflected power estimate. In step 890A, the microcontroller 160 sends a signal to the actuator 215 to change the impedance of the variable inductor 712 to minimize the reflected power level. Step 890A may include recording multiple reflected power levels and repeating the changing of the impedance until a difference between two estimated reflected power levels is below a selected threshold. As would be understood by a person of ordinary skill in the art, step 890A may include closed loop control of the variable inductor 712.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for tuning an electrically short, navigational beacon antenna adapted for use with a radio transmitter and an electrical ground, the apparatus comprising:
   an impedance matching network comprising:
   a first end configured to be in electrical communication with the radio transmitter, the radio transmitter generating a medium or high power signal between 190 kHz and 1800 kHz with a wavelength about ten times or greater than a longest dimension of the electrically short, navigational beacon antenna;
   a second end configured to be in electrical communication with the electrically short, navigational beacon antenna;
   a first impedance element electrically connected between the first end and the second end; and
   a second impedance element electrically connected between the first end and the electrical ground;
   wherein each of the impedance elements comprises an air core variable inductor and wherein each of the impedance elements only comprise non-capacitive circuit components.

2. The apparatus of claim 1, further comprising:
   a sensor configured to estimate radio signal strength; and
   a microcontroller configured to receive the estimated radio signal strength from the sensor and to transmit the estimated radio signal strength to the radio transmitter.

3. The apparatus of claim 2, wherein the sensor is a near-field signal strength detector.

4. The apparatus of claim 1, further comprising:
   a signal generator configured to transmit a generated signal through the impedance matching network separate from the radio transmitter.

5. The apparatus of claim 4, wherein the signal generator is configured to limit the generated signal to a power level below a threshold that is harmful to humans.

6. The apparatus of claim 1, wherein the radio transmitter is configured to operate in frequency band of about 190 kilohertz to about 535 kilohertz.

7. A system for radio tuning, the system adapted for use with an electrical ground comprising:
   an electrically short, navigational beacon antenna;
   a radio transmitter, the radio transmitter generating a medium or high power signal between 190 kHz and 1800 kHz with a wavelength about ten times or greater than a longest dimension of the electrically short, navigational beacon antenna; and
   an antenna tuning unit electrically connected between the electrically short, navigational beacon antenna and the radio transmitter, the antenna tuning unit comprising:
   an impedance matching network comprising:
      a first end configured to be in electrical communication with the radio transmitter;
      a second end configured to be in electrical communication with the electrically short, navigational beacon antenna;
      a first impedance element electrically connected between the first end and the second end; and
      a second impedance element electrically connected between the first end and the electrical ground;
      wherein each of the impedance elements comprises an air core variable inductor and wherein each of the impedance elements only comprise non-capacitive circuit components.

8. The system of claim 7, further comprising:
   a sensor configured to estimate radio signal strength; and
   a microcontroller configured to receive the estimated radio signal strength from the sensor and to transmit the estimated radio signal strength to the radio transmitter.

9. The system of claim 8, further comprising:
   a target radio signal strength; and
   a closed loop controller configured to transmit a power adjustment signal to the radio transmitter based on the estimated radio signal strength received from the microcontroller and the target radio signal strength.

10. The system of claim 8, wherein the sensor is a near-field signal strength detector.

11. The system of claim 7, wherein the antenna tuning unit further comprises:
    a signal generator configured to transmit a generated signal to the first end.

12. The system of claim 11, wherein the signal generator is configured to limit the generated signal to a power level below a threshold that is harmful to humans.

13. The system of claim 7, wherein the radio transmitter is configured to operate in a frequency band of about 190 kilohertz to about 535 kilohertz.

14. A method for tuning an electrically short, navigational beacon antenna adapted for use with an electrical ground and using an impedance matching network electrically connected between the electrically short, navigational beacon antenna and a radio transmitter, comprising the steps of:
    providing the impedance matching network comprising:
       a first end configured to receive a signal from the radio transmitter, the radio transmitter generating a medium or high power signal between 190 kHz and 1800 kHz with a wavelength about ten times or greater than a longest dimension of the electrically short, navigational beacon antenna;
       a second end electrically connected to the electrically short, navigational beacon antenna;
       a first impedance element comprising at least one air core variable inductor and electrically disposed between the first end and the second end; and
       a second impedance element comprising at least one air core variable inductor and electrically disposed between the first end and the electrical ground;
       wherein each of the impedance elements only comprise non-capacitive circuit components; the method comprising:
    varying a value of at least one of the impedance elements to reduce signal reflection in the signal transmitted from the radio transmitter to the electrically short, navigational beacon antenna.

15. The method of claim 14, wherein the impedance matching network is configured to operate between 190 kilohertz and 535 kilohertz.

16. An apparatus for tuning a navigational beacon antenna adapted for use with a radio transmitter and an electrical ground, the apparatus comprising:
    an impedance matching L-network comprising:
    a first end configured to be in electrical communication with the radio transmitter, the radio transmitter generating a medium or high power signal between 190 kHz and 1800 kHz with a wavelength about ten times or greater than a longest dimension of the navigational beacon antenna;
    a second end configured to be in electrical communication with the navigational beacon antenna;

a first impedance element comprises an air core variable inductor electrically connected between the first end and the second end; and a second impedance element comprises an air core variable inductor electrically connected between the first end and the electrical ground;

wherein each of the impedance elements being independent of capacitive circuit components.

17. The apparatus of claim 16, further comprising:

a sensor configured to estimate radio signal strength; and a microcontroller configured to receive the estimated radio signal strength from the sensor and to transmit the estimated radio signal strength to the radio transmitter.

18. The apparatus of claim 17, wherein the sensor is a near-field signal strength detector.

19. The apparatus of claim 16, further comprising:

a signal generator configured to transmit a generated signal through the impedance matching L-network separate from the radio transmitter.

20. The apparatus of claim 19, wherein the signal generator is configured to limit the generated signal to a power level below a threshold that is harmful to humans.

21. The apparatus of claim 16, wherein the radio transmitter is configured to operate in frequency band of about 190 kilohertz to about 535 kilohertz.

22. A system for radio tuning adapted for use with an electrical ground, the system comprising:

an electrically short, navigational beacon antenna;

a radio transmitter, the radio transmitter generating a medium or high power signal between 190 kHz and 1800 kHz with a wavelength about ten times or greater than a longest dimension of the electrically short, navigational beacon antenna; and an antenna tuning unit electrically connected between the electrically short, navigational beacon antenna and the radio transmitter, the antenna tuning unit comprising:

an impedance matching L-network comprising:

a first end configured to be in electrical communication with the radio transmitter;

a second end configured to be in electrical communication with the electrically short, navigational beacon antenna;

a first impedance element electrically connected between the first end and the second end; and a second impedance element electrically connected between the first end and the electrical ground;

wherein each of the impedance elements comprises an air core variable inductor and wherein each of the impedance element being independent of capacitive circuit components.

23. The system of claim 22, further comprising:

a sensor configured to estimate radio signal strength; and a microcontroller configured to receive the estimated radio signal strength from the sensor and to transmit the estimated radio signal strength to the radio transmitter.

24. The system of claim 23, further comprising:

a target radio signal strength; and a closed loop controller configured to transmit a power adjustment signal to the radio transmitter based on the estimated radio signal strength received from the microcontroller and the target radio signal strength.

25. The system of claim 23, wherein the sensor is a near-field signal strength detector.

26. The system of claim 22, wherein the antenna tuning unit further comprises:

a signal generator configured to transmit a generated signal to the first end.

27. The system of claim 26, wherein the signal generator is configured to limit the generated signal to a power level below a threshold that is harmful to humans.

28. The system of claim 22, wherein the radio transmitter is configured to operate in a frequency band of about 190 kilohertz to about 535 kilohertz.

29. A method for tuning an antenna adapted for use with an electrical ground and using an impedance matching L-network electrically connected between the antenna and a radio transmitter, comprising the steps of:

providing the impedance matching L-network comprising:

a first end configured to receive a signal from the radio transmitter;

a second end electrically connected to the antenna;

at least one air core variable inductor electrically disposed between the first end and the second end; and at least one air core variable inductor electrically disposed between the first end and the electrical ground; and varying a value of at least one of the inductors to reduce signal reflection in the signal transmitted from the radio transmitter to the antenna;

wherein the radio transmitter generating a medium or high power signal between 190 kHz and 1800 kHz with a wavelength about ten times or greater than a longest dimension of the antenna.

30. The method of claim 29, wherein the antenna is electrically short.

31. The method of claim 29, further comprising the step of:

operating the impedance matching L-network between 190 kilohertz and 535 kilohertz.

32. An apparatus for tuning an electrically short, navigational beacon antenna adapted for use with a radio transmitter and an electrical ground, the apparatus comprising:

an impedance matching L-network being independent of capacitive circuit components, comprising:

a first end configured to be in electrical communication with a radio transmitter;

a second end configured to be in electrical communication with the electrically short, navigational beacon antenna;

at least one variable air inductor electrically connected between the first end and the second end; and at least one variable air inductor electrically connected between the first end and the electrical ground;

wherein the radio transmitter generating a medium or high power signal between 190 kHz and 1800 kHz with a wavelength about ten times or greater than a longest dimension of the electrically short, navigational beacon.

33. The apparatus of claim 32, further comprising:

a sensor configured to estimate radio signal strength; and a microcontroller configured to receive the estimated radio signal strength from the sensor and to transmit the estimated radio signal strength to the radio transmitter.

34. The apparatus of claim 33, wherein the sensor is a near-field signal strength detector.

35. The apparatus of claim 32, further comprising:

a signal generator configured to transmit a generated signal through the impedance matching L-network separate from the radio transmitter.

36. The apparatus of claim 35, wherein the signal generator is configured to limit the generated signal to a power level below a threshold that is harmful to humans.

37. The apparatus of claim 32, wherein the radio transmitter is configured to operate in frequency band of about 190 kilohertz to about 535 kilohertz.

38. A system for radio tuning adapted for use with an electrical ground, the system comprising:
an electrically short, navigational beacon antenna;
a radio transmitter, the radio transmitter generating a medium or high power signal between 190 kHz and 1800 kHz with a wavelength about ten times or greater than a longest dimension of the electrically short, navigational beacon; and
an antenna tuning unit electrically connected between the electrically short, navigational beacon antenna and the radio transmitter, the antenna tuning unit comprising:
an impedance matching L-network being independent of capacitive circuit components, comprising:
a first end configured to be in electrical communication with the radio transmitter;
a second end configured to be in electrical communication with the electrically short, navigational beacon antenna;
a variable air inductor electrically connected between the first end and the second end; and
a variable air inductor electrically connected between the first end and the electrical ground.

39. The system of claim 38, further comprising:
a sensor configured to estimate radio signal strength; and
a microcontroller configured to receive the estimated radio signal strength from the sensor and to transmit the estimated radio signal strength to the radio transmitter.

40. The system of claim 39, further comprising:
a target radio signal strength; and
a closed loop controller configured transmit a power adjustment signal to the radio transmitter based on the estimated radio signal strength received from the microcontroller and the target radio signal strength.

41. The system of claim 39, wherein the sensor is a near-field signal strength detector.

42. The system of claim 38, wherein the antenna tuning unit further comprises:
a signal generator configured to transmit a generated signal to the first end.

43. The system of claim 42, wherein the signal generator is configured to limit the generated signal to a power level below a threshold that is harmful to humans.

44. The system of claim 38, wherein the radio transmitter is configured to operate in a frequency band of about 190 kilohertz to about 535 kilohertz.

45. A method for tuning an electrically short, navigational beacon antenna adapted for use with an electrical ground and using an impedance matching L-network electrically connected between the electrically short, navigational beacon antenna and a radio transmitter, comprising the steps of:
providing the impedance matching L-network independent of capacitive circuit components comprising:
a first end configured to receive a signal from the radio transmitter, the radio transmitter generating a medium or high power signal between 190 kHz and 1800 kHz with a wavelength about ten times or greater than a longest dimension of the electrically short, navigational beacon antenna;
a second end electrically connected to the electrically short, navigational beacon antenna;
at least one variable air inductor electrically disposed between the first end and the second end; and
at least one variable air inductor electrically disposed between the first end and the electrical ground; and
varying a value of at least one of the inductors to reduce signal reflection in the signal transmitted from the radio transmitter to the electrically short, navigational beacon antenna.

46. The method of claim 45, further comprising the step of:
operating the impedance matching network between 190 kilohertz and 535 kilohertz.

47. A method for tuning an electrically short, navigational beacon antenna adapted for use with an electrical ground and using an impedance matching network electrically connected between the electrically short, navigational beacon antenna and a radio transmitter, comprising the steps of:
providing the impedance matching network comprising:
a first end configured to receive a signal from the radio transmitter the radio transmitter generating a medium or high power signal between 190 kHz and 1800 kHz with a wavelength about ten times or greater than a longest dimension of the electrically short, navigational beacon antenna;
a second end electrically connected to the electrically short, navigational beacon antenna;
a first impedance element electrically disposed between the first end and the second end; and
a second impedance element electrically disposed between the first end and the electrical ground;
wherein each of the impedance elements being independent of capacitive circuit components and including at least one air core variable inductor; and
varying a value of at least one of the impedance elements to reduce signal reflection in the signal transmitted from the radio transmitter to the electrically short, navigational beacon antenna.

48. The method of claim 47, further comprising the step of:
operating the impedance matching network between 190 kilohertz and 535 kilohertz.

49. The method of claim 47, further comprising the steps of:
sensing an estimated radio signal strength; and
transmitting the estimated radio strength to the radio transmitter.

50. The method of claim 49, wherein the sensor is a near-field signal strength detector.

51. The method of claim 49, further comprising the steps of:
generating a signal;
transmitting the generated signal through the impedance matching network; and
separating the generated signal from the radio transmitter.

52. The method of claim 49, further comprising the steps of:
determining a target radio signal strength; and
transmitting a power adjustment signal to the radio transmitter based on the estimated radio signal strength and the target radio signal strength.

* * * * *